(12) United States Patent
Koh et al.

(10) Patent No.: US 7,178,584 B2
(45) Date of Patent: Feb. 20, 2007

(54) PLASMA POLYMERIZATION ENHANCEMENT OF SURFACE OF METAL FOR USE IN REFRIGERATING AND AIR CONDITIONING

(75) Inventors: Seok-Keun Koh, Seoul (KR); Hyung Jin Jung, Seoul (KR); Won Kook Choi, Seoul (KR); Byung Ha Kang, Seoul (KR); Ki Hwan Kim, Seoul (KR); Sam Chul Ha, Kyungsangnam-Do (KR); Cheol Hwan Kim, Kyungsungnam-Do (KR); Sung-Chang Choi, Seoul (KR)

(73) Assignees: Korea Institute of Science and Technology, Seoul (KR); LG Electronics Inc., Seoul (KR)

( * ) Notice: Subject to any disclaimer, the term of this patent is extended or adjusted under 35 U.S.C. 154(b) by 0 days.

(21) Appl. No.: 10/952,904

(22) Filed: Sep. 30, 2004

(65) Prior Publication Data

US 2005/0061024 A1 Mar. 24, 2005

Related U.S. Application Data

(62) Division of application No. 09/529,052, filed as application No. PCT/KR98/00398 on Dec. 3, 1998, now abandoned.

(51) Int. Cl.
*F28F 13/18* (2006.01)
(52) U.S. Cl. ...................... 165/133; 427/569
(58) Field of Classification Search ............... None
See application file for complete search history.

(56) References Cited

U.S. PATENT DOCUMENTS 2,724,672 A * 11/1955 Rubin ................. 156/287
3,388,562 A * 6/1968 Harle .................. 62/507

(Continued)

FOREIGN PATENT DOCUMENTS

AU 15079/99 A 6/1999

(Continued)

OTHER PUBLICATIONS

Won-Kook Choi, Journal of Vacuum Science & Technology A, vol. 14, No. 4, (Jul./Aug. 1996), pp. 2366-2371.

(Continued)

*Primary Examiner*—Allen J. Flanigan
(74) *Attorney, Agent, or Firm*—Birch, Stewart, Kolasch & Birch, LLP

(57) ABSTRACT

According to the present invention, there is provided a plasma polymerization surface modification of a metal for enhancing its applicability for use in refrigerating and air conditioning such as in constructing heat exchanges, by using a DC discharge plasma, comprising the steps of: (a) positioning an anode electrode which is substantially of metal to be surface-modified and a cathode electrode in a chamber, (b) maintaining a pressure in the chamber at a predetermined vacuum level, (c) blowing a reaction gas composed of an unsaturated aliphatic hydrocarbon monomer gas or fluorine-containing monomer and silicon containing monomer gas at a predetermined pressure and a non-polymerizable gas at a predetermined pressure into the chamber, and (d) applying a voltage to the electrodes in order to obtain a DC discharge, whereby to obtain a plasma consisting of positive and negative ions and radicals generated from the unsaturated aliphatic hydrocarbon monomer gas and the non-polymerizable gas, and then forming a polymer with hydrophilicity or hydrophobicity on the surface of the anode electrode by plasma deposition, and there is also provided a plasma polymerization surface modification of a metal for enhancing its applicability for use in refrigerating and air conditioning such as in constructing heat exchanges, by using an RF plasma.

2 Claims, 40 Drawing Sheets

U.S. PATENT DOCUMENTS

| | | | | |
|---|---|---|---|---|
| 3,466,189 | A | * 9/1969 | Erb | 428/626 |
| 3,613,779 | A | * 10/1971 | Brown | 165/103 |
| 4,032,440 | A | * 6/1977 | Yasuda | 210/654 |
| 4,132,829 | A | 1/1979 | Hudis | |
| 4,365,483 | A | * 12/1982 | Binger | 62/183 |
| 4,588,641 | A | 5/1986 | Haque et al. | |
| 4,598,022 | A | 7/1986 | Haque et al. | |
| 4,693,799 | A | 9/1987 | Yanagihara et al. | |
| 4,980,196 | A | 12/1990 | Yasuda et al. | |
| 5,137,067 | A | * 8/1992 | Espeut | 165/133 |
| 5,207,248 | A | * 5/1993 | Seki et al. | 138/145 |
| 5,783,641 | A | 7/1998 | Koh et al. | |
| 5,959,058 | A | * 9/1999 | Tonelli et al. | 528/70 |
| 6,099,122 | A | 8/2000 | Chabrecek et al. | 351/160 H |
| 6,192,979 | B1 | * 2/2001 | Koch et al. | 165/201 |
| 6,242,054 | B1 | * 6/2001 | Baalmann et al. | 427/489 |

FOREIGN PATENT DOCUMENTS

| | | | |
|---|---|---|---|
| JP | 5-734518 A | | 2/1982 |
| JP | 57-34518 A | | 2/1982 |
| JP | 59004897 A | * | 1/1984 |
| JP | 02-015169 A | | 1/1990 |
| JP | 215169 A | | 1/1990 |
| JP | 02192597 A | * | 7/1990 |
| JP | 03-045894 A | | 2/1991 |
| JP | 3-045894 A | | 2/1991 |
| JP | 5-503876 A | | 6/1993 |
| JP | 5-179034 A | | 7/1993 |
| JP | 06-207923 A | | 7/1994 |
| JP | 6-207923 A | | 7/1994 |
| JP | 8-057414 A | | 3/1996 |
| JP | 9-133494 A | | 5/1997 |
| WO | WO 93/10283 A1 | | 5/1993 |
| WO | WO 99/27156 A | | 6/1999 |
| WO | WO 99/27156 A1 | | 6/1999 |

OTHER PUBLICATIONS

S.K. Koh, Mat. Res. Soc. Symp. Proc., vol. 396 (1996), pp.261-265.

Won-Kook Choi, Journal of Vacuum Science & Technology A, vol. 14, No. 4, (Jul./Aug. 1996), pp. 2366-2371.

S.K. Koh, Mat. Res. Soc. Symp. Proc., vol. 396, (1996), pp. 261-265.

* cited by examiner

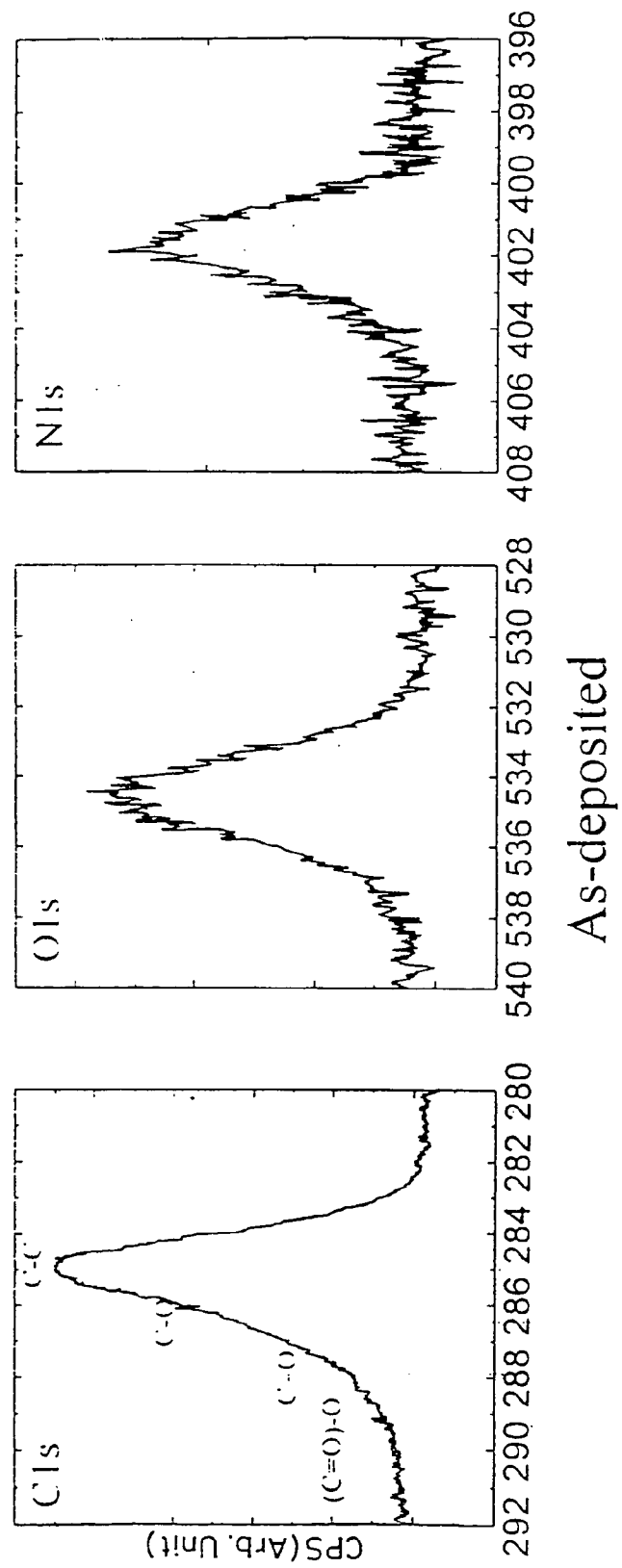

F I G. 10A
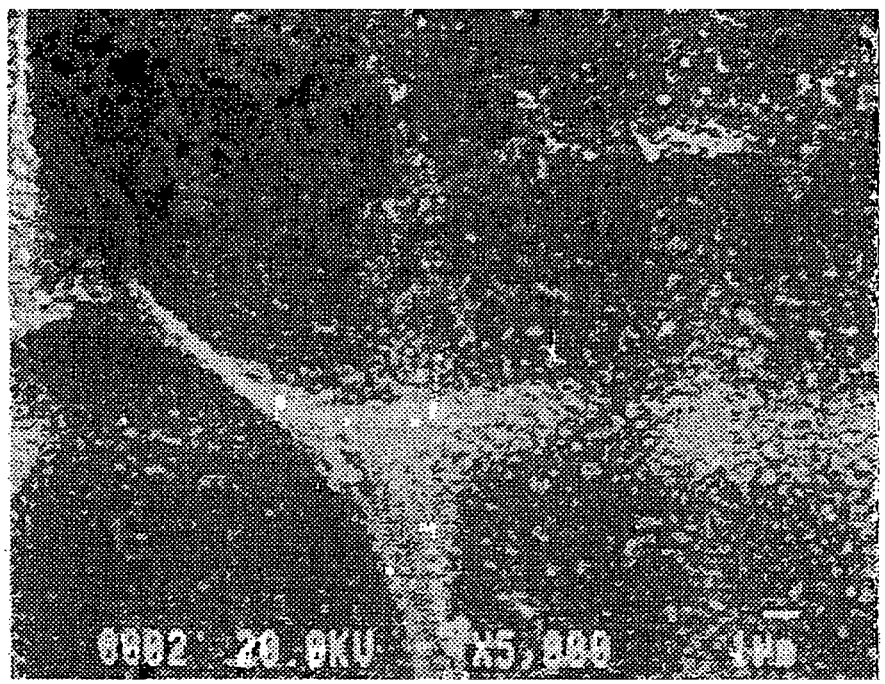
F I G. 10B
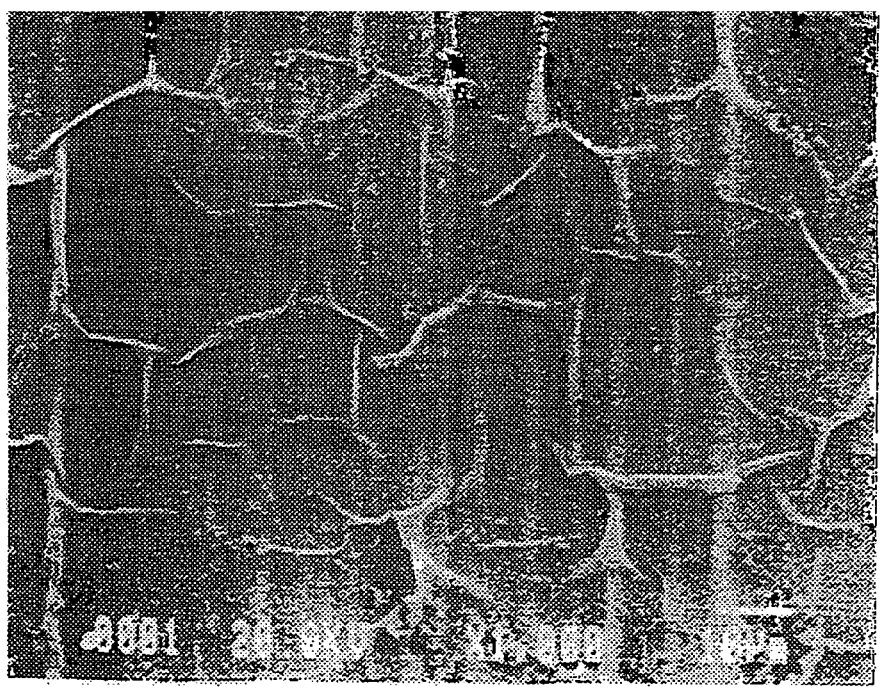

F I G. 12A
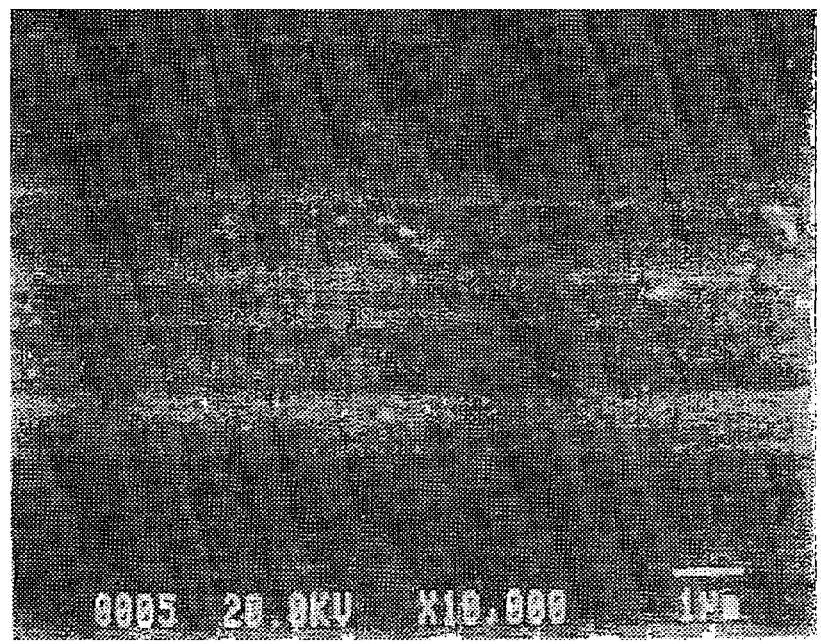
F I G. 12B
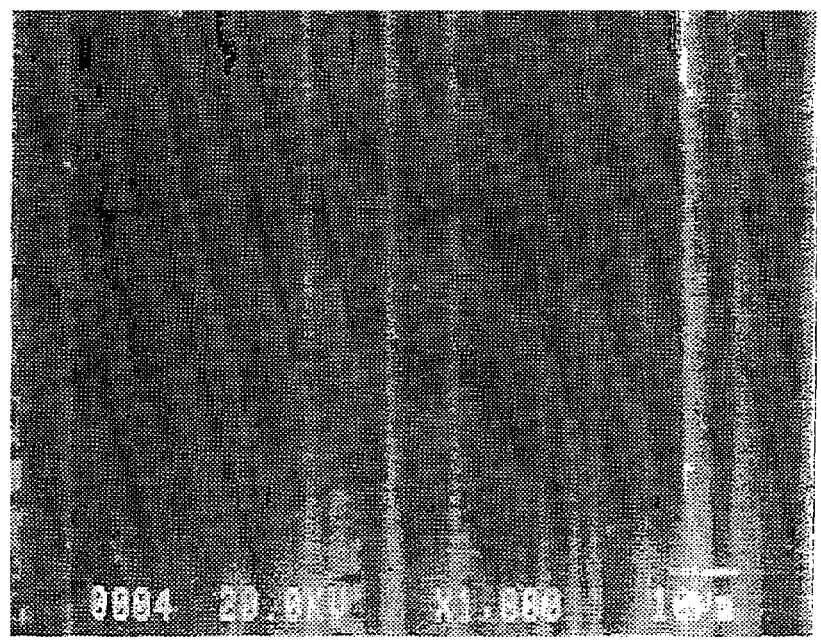

PLASMA POLYMERIZATION ENHANCEMENT OF SURFACE OF METAL FOR USE IN REFRIGERATING AND AIR CONDITIONING

This application is a Divisional of Application No. 09/529,052 filed on Apr. 6, 2000 now abandoned and for which priority is claimed under 35 U.S.C. § 120. Application Ser. No. 09/529,052 is the national phase of PCT International Application No. PCT/KR98/00398 filed on Dec. 3, 1998 under 35 U.S.C. §371. The entire contents of each of the above-identified applications are hereby incorporated by reference. This application also claims priority of Application No. 1997/65740 filed in KOREA on Dec. 4, 1997 under 35 U.S.C. § 119.

TECHNICAL FIELD

The present invention relates to a surface-processing of a material for refrigerating and air conditioning, and in particular to a plasma polymerization for forming a polymer with hydrophilicity or hydrophobicity on a surface of a material by using a DC discharge plasma or an RF discharge plasma.

BACKGROUND ART

A heat exchanger for heat-exchanging two fluids having different temperatures by directly or indirectly contacting the fluids has been widely used in various industrial fields, and especially takes an important role in heating, air conditioning, power generating, exhausted heat recovery and chemical processes.

Especially, a heat exchanger for refrigerating and air conditioning is provided with fins in order to improve heat transfer, as illustrated in FIG. 1. The heat transfer is generated due to low-temperature refrigerants provided in a tube when humid air passes the fins during the heat exchanging operation. When the temperature of the fin surface is lower than a dew point temperature of the humid air, water drops condense on the surface of the heat exchanger, thereby obstructing the air flow, and thus a pressure difference between the heat exchanger's entrance and exit is increased. Therefore, in order to provide an identical flux, blower fan power should be increased, which results in increased power consumption.

In order to solve the problem, a rust resistant process is carried out on the fin of the conventional heat exchanger for providing a corrosion resistant property, a hydrophilicity is provided thereon, and a silicate coating is performed in order to improve a flow of condensed water, which is generally called a pre-coated material (PCM). However, in the PCM manufacturing process, a tetrachloroethane (TCE) for cleansing aluminum and chromium for providing the corrosion-resistance are necessarily used, thereby causing environmental pollution. In addition, the PCM has the excellent hydrophilic property at an initial stage, but with aging gradually loses the hydrophilic property with the lapse of time.

Also, a great deal of chemical goods have been currently employed as a material for wall paper. However, the silicate material for providing the hydrophilic property is volatilized and chemically combined with the wall paper, thereby discoloring the wall paper undesirably.

Efforts have been made to satisfy various demands by forming a functional surface on a material. Among methods known for forming the functional surface are: (1) depositing the functional layer on the surface of the material; and (2) modifying a surface of the material in order to have new physical and chemical properties.

A method for modifying a surface property of a polymer material to hydrophilicity by using an ion beam and a reaction gas has been disclosed by the inventors of the present invention in U.S. Pat. No. 5,783,641. According to this method which is called "Ion Beam Assisted Reaction", the surface of a polymer material is activated by irradiating energetic argon ions and oxygen ions thereon, and at the same time the surface property of the polymer is modified to hydrophilicity by providing the reactive gas around the polymer and forming hydrophilic functional groups on the surface thereof. In this case, according to "Surface Chemical Reaction between Polycarbonate (PC) and keV Energy $Ar^+$ Ion in Oxygen Environment" (J. Vac. Sci. Tech., 14, 359, 1996) which has been disclosed by the inventors of the present invention, the hydrophilic functional groups, such as C—O, C=O, (C=O)—O, etc., are formed on the surface of the polymer. Many polymers, such as PC, PMMA, PET, PE, PI, and silicone rubber can be modified to have a hydrophilic surface by the ion assisted reaction.

In addition, in accordance with "The Improvement of Mechanical Properties of Aluminum Nitride and Alumina By 1 keV $Ar^+$ Irradiation in Reactive Gas Environment" ["Ion-Solid Interactions For Materials Modification And Processing", Mat. Soc. Symp. Proc.396, 261 (1996)] which has been disclosed by the inventors of the present invention, the surface modification by the ion beam assisted reaction is a method which can be used not merely for polymer materials, but the surface modification can be also performed on a ceramic material by the ion beam assisted reaction. The characteristics of the ceramic material, such as the mechanical strength thereof can be improved by forming a new functional layer on the surface thereof.

Also, the ion beam assisted reaction can be employed for a metal. When aluminum is processed by the ion beam assisted reaction, the hydrophilicity of the aluminum metal surface is increased. However, the value of the wetting angle with water varied according to the lapse of time on a surface of a process sample which was measured to examine hydrophilicity. That is, the value of the wetting angle increased with the lapse of time, and was restored to its original value after the lapse of a certain amount of time, and thus the effect of the surface modification was only temporary.

When a metal such as aluminum is processed by the ion beam assisted reaction, hydrophilicity is increased because a native oxide layer is removed by etching carried out on the aluminum surface and a functional layer is formed thereon. That is, the effect of improvement in hydrophilicity is reduced with the lapse of time because a native oxide layer is naturally grown on the aluminum surface, and the aluminum surface is restored to its original state because the functional layer which consists of a thin layer (less than several nanometers) has little mechanical resistance against environmental changes (water, temperature, etc.) with the lapse of time.

Accordingly, forming a hydrophilic layer on the surface of the metal by the ion beam assisted reaction which has been utilized for the polymer and ceramic material is ineffective due to the above-described disadvantage.

This disadvantage in modifying the metal material to have hydrophilicity occurs because the hydrophilic layer is not stable. Thus, a hydrophilic layer which is physically and chemically stable should be formed in order to overcome such a disadvantage. A hydrophilic layer which is stable on the metal surface can be formed by depositing a hydrophilic polymer.

In order to deposit a polymer on a material by the conventional deposition technique, at least several process steps are required: (1) synthesizing a monomer; (2) performing a polymerization so as to form a polymer or an intermediate polymer for a next succeeding step; (3) producing a coating solution; (4) cleansing and/or conditioning of a substrate surface by application of primer or coupling agent; (5) coating; (6) drying a coated layer; and (7) curing the coated layer.

The above-described process can be replaced by a one-step plasma polymerization process by introducing a gaseous material to be polymerized into a vacuum chamber under a relatively low vacuum state ($10^{-2}$–$10^1$ Torr), forming a gas plasma by using DC power or RF power, and simultaneously generating a reaction of various ionized gases, radicals and the like which are formed inside the plasma under the applied energy. To form a polymer and depositing same on a substrate, the polymer formed according to the plasma polymerization has strong adhesion to the substrate and high chemical resistance.

For example, the plasma polymerization may be performed on the metal surface according to the technique disclosed in U.S. Pat. No. 4,980,196. A low-temperature plasma process is employed so as to prevent corrosion of a steel, the process including the steps of: (1) pretreating the steel substrate by a reactive or inert gas plasma; (2) using DC power from 100–2000 volts, preferably 300–1200 volts for the plasma deposition; (3) making the steel substrate the cathode; (4) having anode(s) equipped with magnetic enhancement (i.e. magnetron); and (5) using organosilane vapors (with or without non-polymerizable gas) as the plasma gas to be deposited. That is, in accordance with U.S. Pat. No. 4,980,196, the cathode is used as the substrate, and a magnetron is installed on the anode. The plasma is formed on the steel substrate by using the organosilane vapors and DC power. The plasma polymerization is then carried out. In addition, the above-described patent further discloses performing a primer coating after the plasma polymerization.

However, a magnetron must be installed at the anode side to perform the above-described process, and thus the device is more complicated. There is another disadvantage to the process in that the degree of hydrophilicity or hydrophobicity cannot be controlled.

DISCLOSURE OF THE INVENTION

According to the present invention, there is provided a plasma polymerization surface modification of a metal for enhancing its applicability for use in refrigerating and air conditioning such as in constructing a heat exchanges, by using a DC discharge plasma, comprising the steps of: (a) positioning an anode electrode which is substantially of metal to be surface-modified and a cathode electrode in a chamber, (b) maintaining a pressure in the chamber at a predetermined vacuum level, (c) blowing a reaction gas composed of an unsaturated aliphatic hydrocarbon monomer gas at a predetermined pressure and a non-polymerizable gas at a predetermined pressure into the chamber, the non-polymerizable gas being 50–90% of the entire reaction gas, and (d) applying a voltage to the electrodes in order to obtain a DC discharge, whereby to obtain a plasma consisting of positive and negative ions and radicals generated from the unsaturated aliphatic hydrocarbon monomer gas and the non-polymerizable gas, and then forming a polymer with hydrophilicity on the surface of the anode electrode by plasma deposition.

There is also provided a plasma polymerization surface modification of a metal for enhancing its applicability for use in refrigerating and air conditioning such as in constructing a heat exchanges, by using a DC plasma, comprising the steps of: (a) positioning an anode electrode which is substantially of metal to be surface-modified and a cathode electrode in a chamber, (b) maintaining a pressure in the chamber at a predetermined vacuum level, (c) blowing a reaction gas composed of an unsaturated aliphatic hydrocarbon monomer gas at a predetermined pressure and a non-polymerizable gas at a predetermined pressure into the chamber, the non-polymerizable gas being under 50% of the entire reaction gas, and (d) applying a voltage to the electrodes in order to obtain a DC discharge, whereby to obtain a plasma consisting of positive and negative ions and radicals generated from the unsaturated aliphatic hydrocarbon monomer gas and the non-polymerizable gas, and then forming a polymer with hydrophobicity on the surface of the anode electrode by plasma deposition.

There is also provided a plasma polymerization surface modification of a metal for enhancing its applicability for use in refrigerating and air conditioning such as in constructing a heat exchanges, by using a DC plasma, comprising the steps of: (a) positioning an anode electrode which is substantially of metal to be surface-modified and a cathode electrode in a chamber, (b) maintaining a pressure in the chamber at a predetermined vacuum level, (c) blowing a reaction gas composed of a fluorine-containing monomer gas at a predetermined pressure and a non-polymerizable gas at a predetermined pressure into the chamber, the non-polymerizable gas being 0–90% of the entire reaction gas, and (d) applying a voltage to the electrodes in order to obtain a DC discharge, whereby to obtain a plasma consisting of positive and negative ions and radicals generated from the fluorine-containing monomer gas and the non-polymerizable gas, and then forming a polymer with hydrophobicity on the surface of the anode electrode by plasma deposition.

In addition, there is provided a plasma polymerization surface modification of a metal for enhancing its applicability for use in refrigerating and air conditioning such as in constructing a heat exchanges, by using an RF plasma, comprising the steps of: (a) positioning a passive electrode which is substantially of metal to be surface-modified and an active electrode in a chamber, (b) maintaining a pressure in the chamber at a predetermined vacuum level, (c) blowing a reaction gas composed of an unsaturated aliphatic hydrocarbon monomer gas at a predetermined pressure and a non-polymerizable gas at a predetermined pressure into the chamber, the non-polymerizable gas being 50–90% of the entire reaction gas, and (d) applying a voltage to the electrodes in order to obtain a RF discharge, whereby to obtain a plasma consisting of positive and negative ions and radicals generated from the unsaturated aliphatic hydrocarbon monomer gas and the non-polymerizable gas, and then forming a polymer with hydrophilicity on the surface of the passive electrode by plasma deposition.

There is also provided a plasma polymerization surface modification of a metal for enhancing its applicability for use in refrigerating and air conditioning such as in constructing a heat exchanges, by using an RF plasma, comprising the steps of: (a) positioning a passive electrode which is substantially of metal to be surface-modified and an active electrode in a chamber, (b) maintaining a pressure in the chamber at a predetermined vacuum level, (c) blowing a reaction gas composed of an unsaturated aliphatic hydrocarbon monomer gas at a predetermined pressure and a non-polymerizable gas at a predetermined pressure into the chamber, the non-polymerizable gas being under 50% of the entire reaction gas, and (d) applying a voltage to the electrodes in order to obtain a RF discharge, whereby to obtain a plasma consisting of positive and negative ions and radicals generated from the unsaturated aliphatic hydrocarbon monomer gas and the non-polymerizable gas, and then forming a polymer with hydrophobicity on the surface of the passive electrode by plasma deposition.

There is also provided a plasma polymerization surface modification of a metal for enhancing its applicability for use in refrigerating and air conditioning such as in constructing a heat exchanges, by using an RF plasma, comprising the steps of: (a) positioning an active electrode which is substantially of metal to be surface-modified and a passive electrode in a chamber, (b) maintaining a pressure in the chamber at a predetermined vacuum level, (c) blowing a reaction gas composed of a fluorine-containing monomer gas at a predetermined pressure and a non-polymerizable gas at a predetermined pressure into the chamber, the non-polymerizable gas being 0–90% of the entire reaction gas, and (d) applying a voltage to the electrodes in order to obtain a RF discharge, whereby to obtain a plasma consisting of positive and negative ions and radicals generated from the fluorine-containing monomer gas and the non-polymerizable gas, and then forming a polymer with hydrophobicity on the surface of the active electrode by plasma deposition.

Here, the non-polymerizable gas cannot be polymerized into a polymer by itself but can be used and polymerized together with any other monomer gas, such as $O_2$, $N_2$, $CO_2$, $CO$, $H_2O$ and $NH_3$ gas.

There are also provided a polymer with superior hydrophilicity or hydrophobicity and a polymer with strong painting and corrosion-resistant properties produced according to the above-described methods.

BRIEF DESCRIPTION OF THE DRAWINGS

FIG. 6A is a graph illustrating the XPS spectra obtained from polymers at the anode side by a DC discharge for 1 minute (pressure: 0.3 Torr, current: 2 $mA/cm^2$, voltage: 1 kV, acetylene : nitrogen=5:5);

FIGS. 10A and 10B are SEM micrographs illustrating the surface of a polymer with hydrophilicity among the polymers polymerized by the DC discharge photographed by a scanning electron microscope;

FIGS. 12A and 12B are SEM micrographs illustrating the surface of a polymer with hydrophilicity among the polymers polymerized by the RF discharge photographed by a scanning electron microscope;

MODES FOR CARRYING OUT THE PREFERRED EMBODIMENTS

Figure 1:
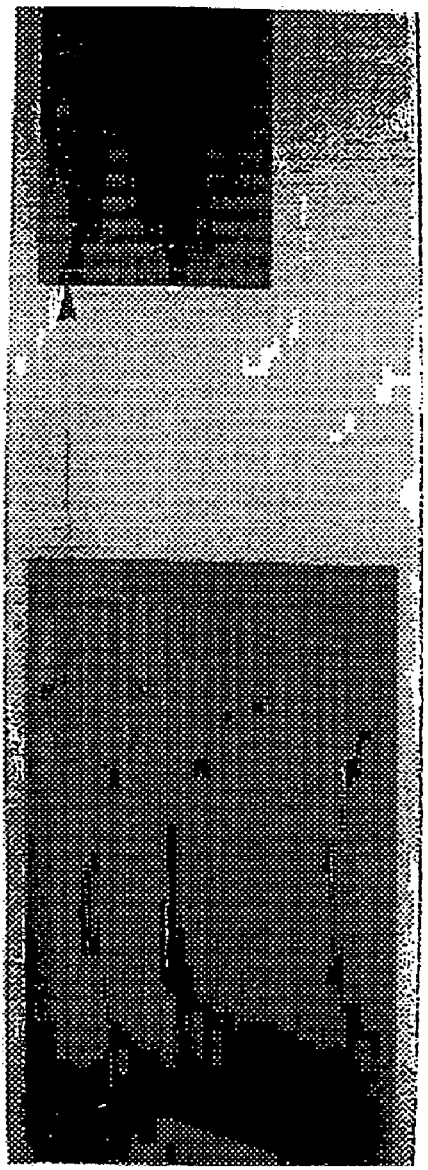
FIG. 1 is a photograph of a fin employed for a heat exchanger in a refrigerating and air conditioning apparatus.
Figure 2:
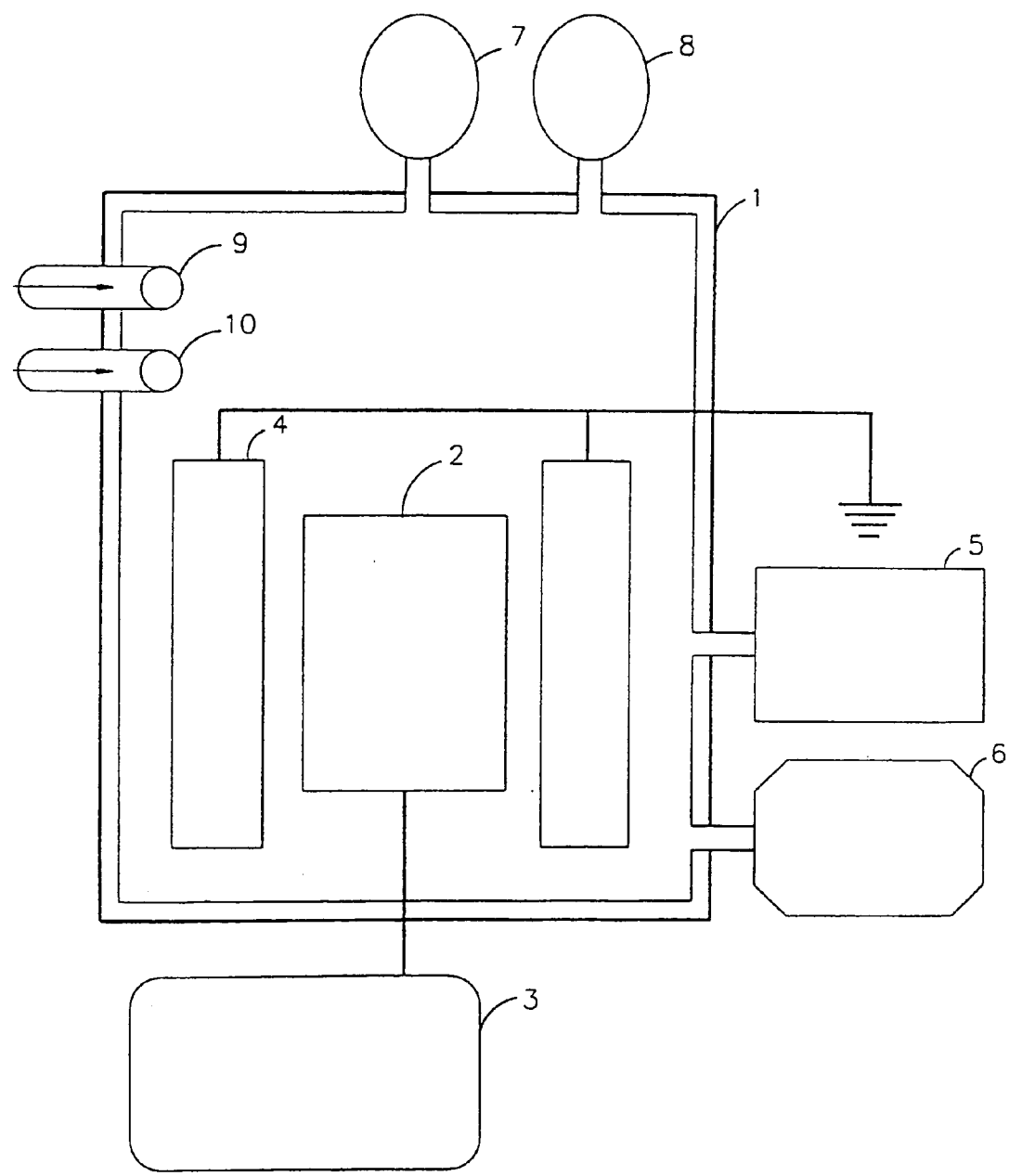
FIG. 2 is a schematic view illustrating a device for a plasma polymerization for employing the present invention.

FIG. 2 illustrates a schematic view of a experimental device used for the present invention. The device basically includes: a vacuum chamber; a vacuum pump for evacuating the vacuum chamber; a unit for measuring a vacuum degree; a power supplying unit for generating an electric potential difference to a substrate to be surface-modified; a substrate holder for fixing the substrate; and a reaction gas controller for blowing a reaction gas around the substrate.

A substrate 2 is provided in the chamber 1. Whether the internal pressure of the chamber 1 is maintained at a vacuum state of about $10^{-3}$ Torr by driving a rotary pump 6 is confirmed by a thermocouple gauge 7. Then, whether the internal pressure thereof is maintained at about $10^{-6}$ Torr by driving a diffusion pump 5 is confirmed by an ion gauge 8. The substrate 2 is biased to an anode (or passive electrode) by a power supply 3. An electrode 4 at the opposite side is grounded. When the chamber 1 is maintained at a predetermined vacuum state, a reaction gas comprising an unsaturated aliphatic hydrocarbon monomer gas such as acetylene supplied via a gas inlet 9 and non-polymerizable gas such as nitrogen supplied via a gas inlet 10 is sequentially blown into preferred positions. A mixture ratio of the reaction gas is controlled by the thermocouple gauge 7. When the gas in the vacuum chamber reaches a predetermined pressure, it is discharged by using DC or RF. Here, molecular bonds in the reaction gases are broken in a plasma generated by DC or RF. Broken chains and activated cations or anions are combined, thus forming a polymer on a surface of the substrate positioned between the electrodes. The substrate is mostly made of metallic aluminum Al, but may be made of an insulator, ceramics or polymer material.

Anode and Cathode

The polymer can be polymerized both at the anode and the cathode by DC power applied in order to form the plasma during the plasma polymerization. Here, the polymers polymerized at the anode and cathode have different properties respectively. The ions, radicals and free electrons formed in the plasma are polymerized dependent on the polarity of the electrode by receiving energy by electrical attraction. Here, negatively charged particles and the free electrons formed in the plasma are drawn toward the anode, and positively charged particles are drawn toward the cathode. That is, different kinds of energetic particles are polymerized at the anode and the cathode respectively, and thus the polymers polymerized at the anode and cathode have different properties, which is confirmed by an FT-IR (Fourier transform infrared/raman spectrometer) analysis.

According to the present invention, the FT-IR spectra are obtained by using a BRUKER. IFS120HR.

Yasuda et al. ("Plasma Polymerization", Academic Press, 1985) studied a plasma polymerized film deposited on a metal inserted between an anode and cathode by a glow discharge of acetylene and found that FT-IR signals were increased at a carbonyl region (ketone and aldehyde generally absorb at 1665–1740 $cm^{-1}$). They also found that signals at a hydroxyl O—H bond stretching band (3200–3600 $cm^{-1}$) were more remarkably increased than C—H stretching signals (about 2900 $cm^{-1}$), and that the concentration of the free-radicals was decreased with lapse of time. When the concentration of the free-radicals was measured by ESR (electron spin resonance) for 15 months, it was reduced to 87%. Reduction of the free-radicals progressed very slowly like oxidation of the polymer. It shows that the radicals were stable and oxygen was not infiltrated into the layer. Accordingly, stability of radicals and non-infiltration of oxygen was due to the highly branched and highly cross-linked network.

The existence of the highly branched network can be recognized by the infrared ray spectra even without a signal from a Methylene chain. A strong and broad O—H stretching absorption shifts down from the high to low 3000 $cm^{-1}$ region by an intra-molecular hydrogen bond, which suggests that it is a branched hydrocarbon polymer.

Therefore, the glow discharge polymer of acetylene is a highly cross-linked and highly branched hydrocarbon polymer including the free radic high concentration. When the layer is exposed to the atmosphere, free radicals are reacted with oxygen resulting in formation of carbonyl and hydroxyl groups. It may be advantageous in hydrophilicity.

However, in accordance with the present embodiment, the polymer is polymerized by varying a partial pressure of acetylene and nitrogen gas influencing hydrophilicity.

Figure 3:
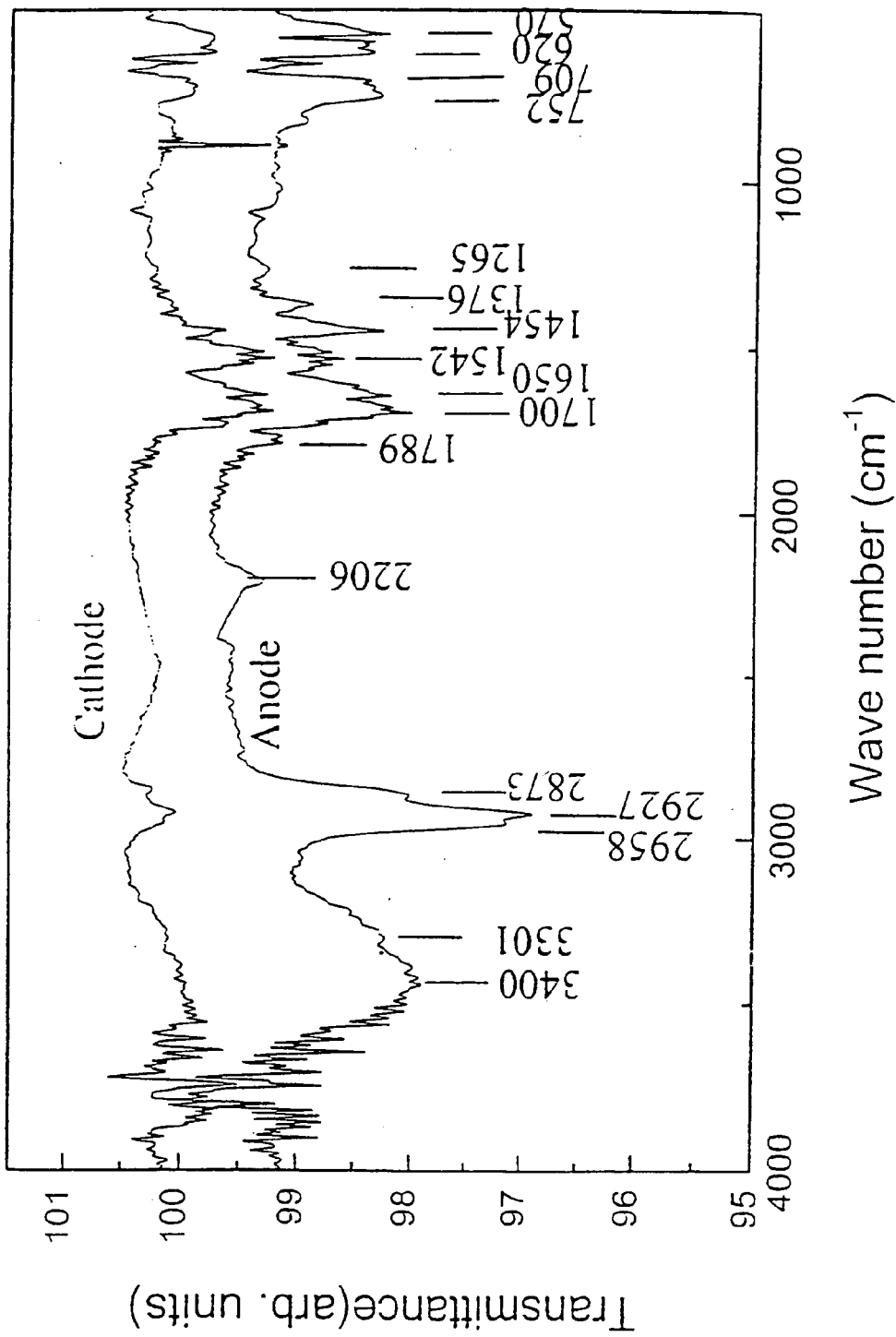
FIG. 3 illustrates FT-IR spectra of an object polymerized on its surfaces at a cathode side and an anode side by DC discharge of acetylene and nitrogen.

FIG. 3 illustrates the FT-IR spectra of an object polymerized on aluminum substrates at the cathode and anode by DC discharge of acetylene and nitrogen. The two substrates were obtained by performing the DC discharge of acetylene and nitrogen for 1 minute (pressure: 0.3 Torr, current: 2 $mA/cm^2$, voltage: 1 kV, acetylene nitrogen=1:1). The spectra show that there is a large difference between the two substrates according to their positions.

As shown in the spectra, the largest peak of the anode polymer is at approximately 2930 $cm^{-1}$, which is generated by C—H stretching and C—H deformation oscillation and observed typically in a polymer such as polyethylene. It implies that the polymerized layer has a similar structure to polyethylene. However, in the case of the polymer deposited on the cathode, the highest peak is between 1700–1400 $cm^{-1}$. In this region, the peaks originated from the oscillations by the bonds between carbon and oxygen such as carbonyl (C=O), or the peaks originated from the oscillations by the bonds between carbon and nitrogen such as amide, amino, amine (C=N) are repeatedly shown. The peak around 2930 $cm^{-1}$ is not remarkable, differently from the anode side. It implies that the hydrogen bonding of carbon is much reduced in the polymer at the cathode side. That is, the acetylene plasma formed by the polymerization forms various types of ions, and the different types of ions are moved to and polymerized at the anode and cathode. Especially in the case of the cathode, it implies that a layer which is remarkably different from acetylene is polymerized. Another strong peak is shown at the range of 3200 $cm^{-1}$. This peak includes an O—H group and a C—N group.

Another difference between the anode layer and cathode layer is the intensity of $CH_2$ rocking motion in aliphatic hydrocarbon. A peak shown around 710 $cm^{-1}$ caused by the $CH_2$ rocking motion is relatively weaker both at the anode side and the cathode side than a peak around 710 $cm^{-1}$ in pure polyethylene. The absorption is not strong in the region between 720 and 770 $cm^{-1}$ due to $C-H_2$ rocking. The peak is a characteristic peak from a straight chain of four or more methylene groups. This peak is not observed in the plasma polymer because a highly branched hydrocarbon chain is formed therein. As shown in the polymer, considering a C—H stretching band at about 2930 $cm^{-1}$ and a C—H bending mode at about 1400 $cm^{-1}$, it is recognized that a highly branched but basically hydrocarbon-based polymer is formed. Here, it is notable that the ratio of the C—H stretching band at 2930 $cm^{-1}$ to the $C-H_2$ stretching band at 720 $cm^{-1}$ is much greater at the anode than the cathode. That is, it implies that, although the hydrocarbon-based polymer is polymerized, the anode side has a more highly cross-linked structure than the cathode side. Such a result shows that the different types of polymers are polymerized according to the substrate position. As discussed earlier, the polymers deposited at the anode and cathode are of different nature. However, the polymers deposited at the anode and cathode all have an excellent hydrophilic property. The polymer deposited at the anode has remarkably strong adhesion to the substrate material, as compared with the polymer deposited at the cathode. Therefore, in case the polymer at the cathode is employed as a product, it may not be stable and the life span thereof may not be long. It is inferred that the weak adhesion of the polymer at the cathode results from increased damage due to the bombardment of positively charged energetic particles, and a weak bonding between the substrate material and the polymer. On the other hand the polymer deposited at the anode has an excellent hydrophilic property and strong adhesion to the substrate material, thus satisfying the functional polymerization and application thereof. As a result, in the first embodiment of the present invention employing the DC discharge, a functional polymer is polymerized preferably at the anode by using the plasma polymerization.

Change in Gas Mixture Ratio

Figure 4:
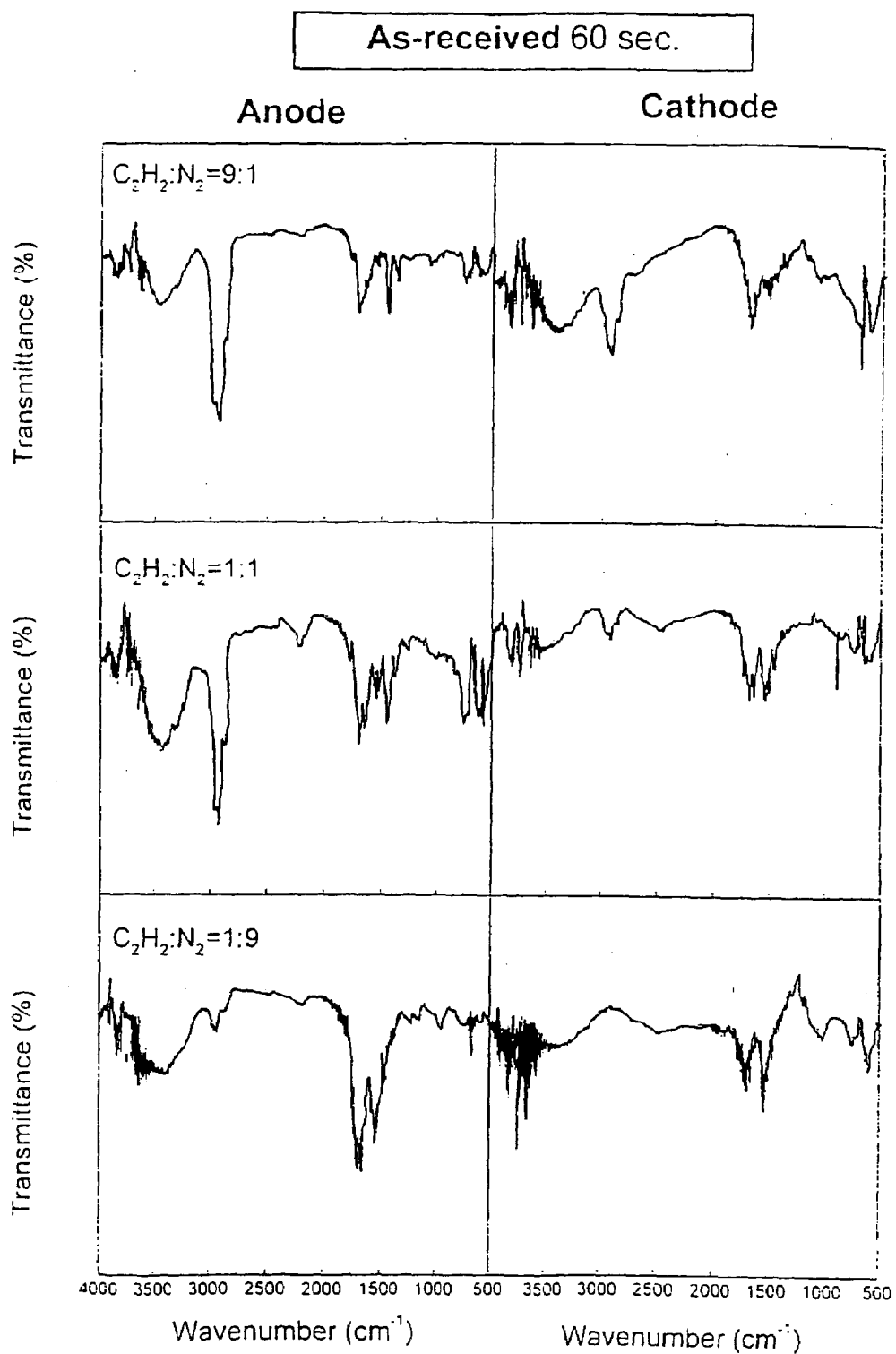
FIG. 4 is a graph illustrating FT-IR spectra examined while changing a mixture ratio of acetylene to nitrogen during the DC discharge thereof under the conditions of a discharge voltage of 1 kV, a discharge current density of 2 $mA/cm^2$ and a total vacuum degree of 0.3 Torr.

FIG. 4 illustrates the FT-IR spectra examined while changing the mixture ratio of acetylene and nitrogen. As the concentration of nitrogen increased, a peak between 1700 and 1400 cm$^{-1}$ increased. As shown in FIG. 3, as the concentration of nitrogen increased, the peak between 1700 and 1400 cm$^{-1}$ caused by the bonds of C=O and C=N relatively increased, as compared with a peak at about 2930 cm$^{-1}$ caused by the C—H stretching. A peak at about 1700 cm$^{-1}$ is deemed to be caused by the bond of C=O (aldehyde or kepton). A peak between 1660 and 1600 cm$^{-1}$ may be caused by the bonds of C=N, C=O (amide, amino acid) and N=H (amine, amide). A peak at about 1400 cm$^{-1}$ is caused by C=N or C=C stretching. As illustrated in FIG. 3, it is noticeable that the intensity of a peak between 1700 and 1630 cm$^{-1}$ is much varied when the concentration of nitrogen is increased. As the concentration, of nitrogen is increased, the peak intensity at about 1630 cm$^{-1}$ is gradually increased. It implies that the peak at about 1630 cm$^{-1}$ is related with a nitrogen compound, such as an amino acid, amine or amide. The increase in nitrogen compounds acts as a hydrophilic functional group, which reduces the contact (wetting) angle. That is, a layer formed by increasing the ratio of nitrogen in a mixture gas for forming the plasma is hydrophilic. It provides a clue for a change of the contact angle.

There has previously been provided just a little information regarding acetylene discharge dissociation. It has been known that positively discharged particles, negatively discharged particles and free radicals are generated in the plasma. According to the present invention, they can be separated by the DC discharge at the anode and cathode. The different polymerizations take place at the anode and cathode due to a difference in the ion species moved to the anode and cathode. This phenomenon was observed by an experiment on the present invention. The deposition rate of the cathode layer was a little higher than that of the anode. The oscillation modes corresponding to various chemical bonds of a discharge polymer is shown in Table 1.

TABLE 1

Oscillation modes corresponding to various chemical bonds at the anode and cathode sides of an acetylene polymer and an acetylene + nitrogen polymer by the DC discharge polymerization.

| Absorption Region Cm$^{-1}$ | Source | Monomer System | | | |
|---|---|---|---|---|---|
| | | $C_2H_2$ | | $C_2H_2 + N_2$ | |
| | | Anode | Cathode | Anode | Cathode |
| 3200–3600 | O—H stretching, hydroxyl bond | — | S | — | No data |
| 3400–3500 | N—H stretching, primary amine | — | — | S | |
| 3310–3350 | N—H stretching, dialkylamine | — | — | S | |
| 3270–3370 | N—H stretching, NH bond secondary amide, trans | — | — | S | |
| 3140–3180 | N—H stretching, NH bond secondary amide, cis | — | — | — | |
| 3070–3100 | N—H stretching, NH bond secondary amide, cis or trans | — | — | — | |
| 2952–2972 | C—H asymmetric stretching, methyl | S | S | S | |
| 2862–2882 | C—H symmetric stretching, methyl | S | S | S | |
| 2916–2936 | C—H asymmetric stretching, methylene | S | S | S | |
| 2848–2863 | C—H symmetric stretching, methylene | — | — | — | |
| 2760 | C—H, aliphatic aldehyde | VW | VW | VW | |
| 2206 | C≡C stretching | W | — | VW | |
| 2089 | | — | M | — | |
| 1955 | | W | — | — | |
| 1880–1895 | | — | M | W | |
| 1800–1815 | | VW | M | W | |
| 1700–1740 | | W | — | M | |
| 1710–1740 | C=O stretching, saturated aldehyde | W | — | M | |
| 1705–1725 | C=O stretching, saturated ketone | W | — | — | |
| 1680–1705 | C=O stretching, unsaturated aldehyde | W | — | — | |
| 1665–1685 | C=O stretching, saturated ketone | — | — | W | |
| 1630–1670 | C=O stretching, tertiary amide | — | — | S | |
| 1630–1680 | C=O stretching, secondary amide | — | S | S | |
| 1560–1640 | N=H band, primary amine | — | — | S | |
| 1515–1570 | N=H band, secondary amide | — | — | S | |
| 1490–1580 | N=H band, secondary amine | — | — | S | |
| 1445–1485 | N=H asymmetric band, methylene | W | W | | |
| 1430–1470 | C=H asymmetric band, methyl | S | W | S | |
| 1325–1440 | C=C aldehyde | — | W | — | |
| 1370–1380 | C=H symmetric band, methyl | W | W | W | |
| 1250–1290 | C=O val. aromatic, alcohol | W | VW | M | |
| 1050–1200 | C=O val., ether | S | — | S | |
| 1024 | | — | M | — | |
| 993 | C=C different, C—H, CH$_2$ | M | — | M | |
| 950–970 | | — | W | M | |
| 768–800 | C=C, C—H, CH$_2$, aliphatic | W | W | M | |
| 640–760 | CH$_2$ rocking, aliphatic | S | W | — | |
| 638–646 | | — | S | S | |

Influences of Annealing

The contact (wetting) angle of the substrate measured under each condition by a contact anglemeter was between 28° and 120°. When the polymerized substrate was maintained in an ambient atmosphere at 250° C. for 2 hours, the contact (wetting) angle of the substrate which had an initial contact angle of 120° was reduced to 58°, and the contact angle of the substrate which had an initial contact angle of 28° was reduced to 16°. It is because the radicals which are not bonded are reacted with reactive gases in the ambient atmosphere by heating of the polymer, thus increasing the concentration of the hydrophilic groups.

Figure 5:
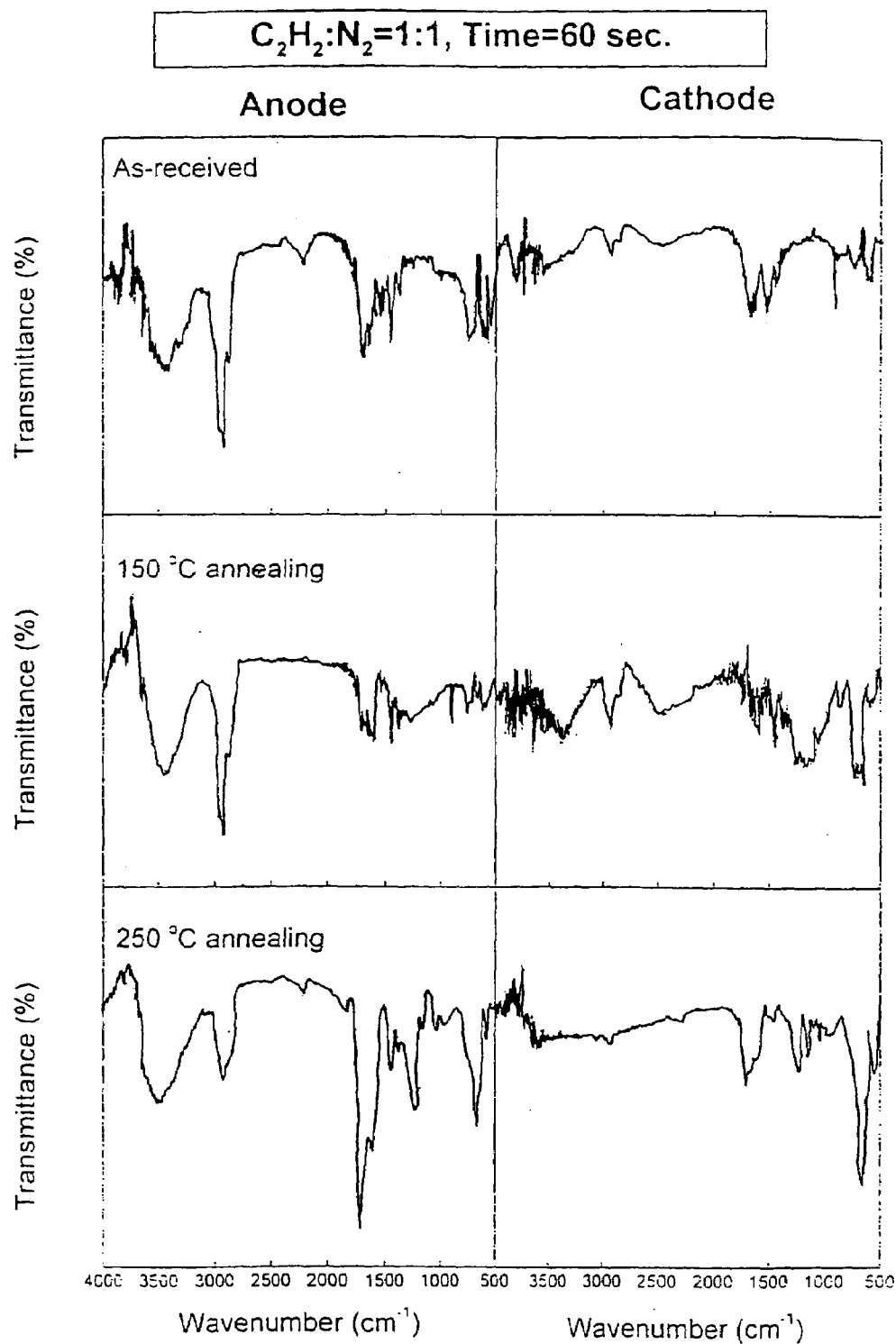
FIG. 5 is a graph illustrating the change in the FT-IR spectra with annealing temperature after annealing a polymer polymerized at the anode and the cathode for 1 hour when the ratio of acetylene to nitrogen is 1:1 under the conditions of a discharge voltage of 1 kV, a discharge current density of 2 $mA/cm^2$ and a total vacuum degree of 0.3 Torr.

FIG. 5 illustrates the change in the FT-IR spectra with the lapse of annealing time. As shown therein, the size of a peak caused by the bonds of C=O and C=N between 1700 and 1400 $cm^{-1}$ is remarkably increased depending on the annealing temperature, as compared with a peak caused by the C—H oscillation at about 2930 $cm^{-1}$. That is, the annealing in the ambient atmosphere increases the concentration of the hydrophilic groups, such as a carbonyl group or amine group. The increase of the hydrophilic groups improves the hydrophilic property of the surface. Actually, a peak at about 1700 $cm^{-1}$ caused by the peak bond (C=O: aldehyde or kepton) and a peak between 1660 and 1600 $cm^{-1}$ (C=N, C=O: amide, amino acid, N=H : amine, amide) are increased in intensity. It is similar to change in the FT-IR spectra caused by the change in the mixture ratio of acetylene to nitrogen. Due to the annealing, the free radicals which are not bonded during the plasma polymerization are reacted, and thus the hydrophilic groups, such as C=O (aldehyde or kepton), C=N, C=O(amide, amino acid) and N=H(amine, amide) are increased, thereby reducing the contact angle.

XPS Analysis

In general, the above-described FT-IR method and an XPS method have been widely used as analysis methods for analyzing the polymer composition and examining its chemical state. According to the present invention, an XPS spectrometer having a non-monchromatized Al K-α source is employed to compare the elemental ratio of C, N and O of the polymer formed by the plasma polymerization. In an extracted discharge polymer, the relative elemental ratio of nitrogen $X_N$ to carbon $X_C$ is determined by the intensity (I) of the peak under the consideration of the ratio of the available cross-section (for example, $X_C$=100%) of electrons emitted from each element under X-ray irradiation. An element ratio of oxygen is determined by a similar method.

FIG. 6A illustrates the XPS spectra obtained from the polymer obtained at the anode side by the DC discharge for 1 minute (pressure: 0.3 Torr, current: 2 $mA/cm^2$, voltage: 1KV, acetylene : nitrogen=5:5). Although the layer was polymerized by maintaining acetylene and nitrogen in a plasma state, a large amount of oxygen is detected. It is thus inferred that oxygen did not exist in the supplied mixture gas, but may remain in the vacuum chamber and join the reaction. It is also considered that the radicals formed during the reaction were reacted with oxygen having strong reactivity and formed an oxygen mixture when exposed to the atmosphere. As shown in the C1s spectra of FIG. 6A, the C—C bond which most polymers contain appears at a position of 285 eV. In the case of a polymer formed by the plasma polymerization, the position of the C1s peak is identical to 285 eV, but the peak forms an asymmetrical shape. The asymmetric property results from the bonding of carbon and oxygen or carbon and nitrogen, such as C—O, C=O, C—N and C=N. The peaks assigned to C—O, C=O, C—N and C=N appeared at higher than 285 eV so that the peak shape became asymmetric. It thus implies that the layer includes the hydrophilic functional group.

Figure 6B:
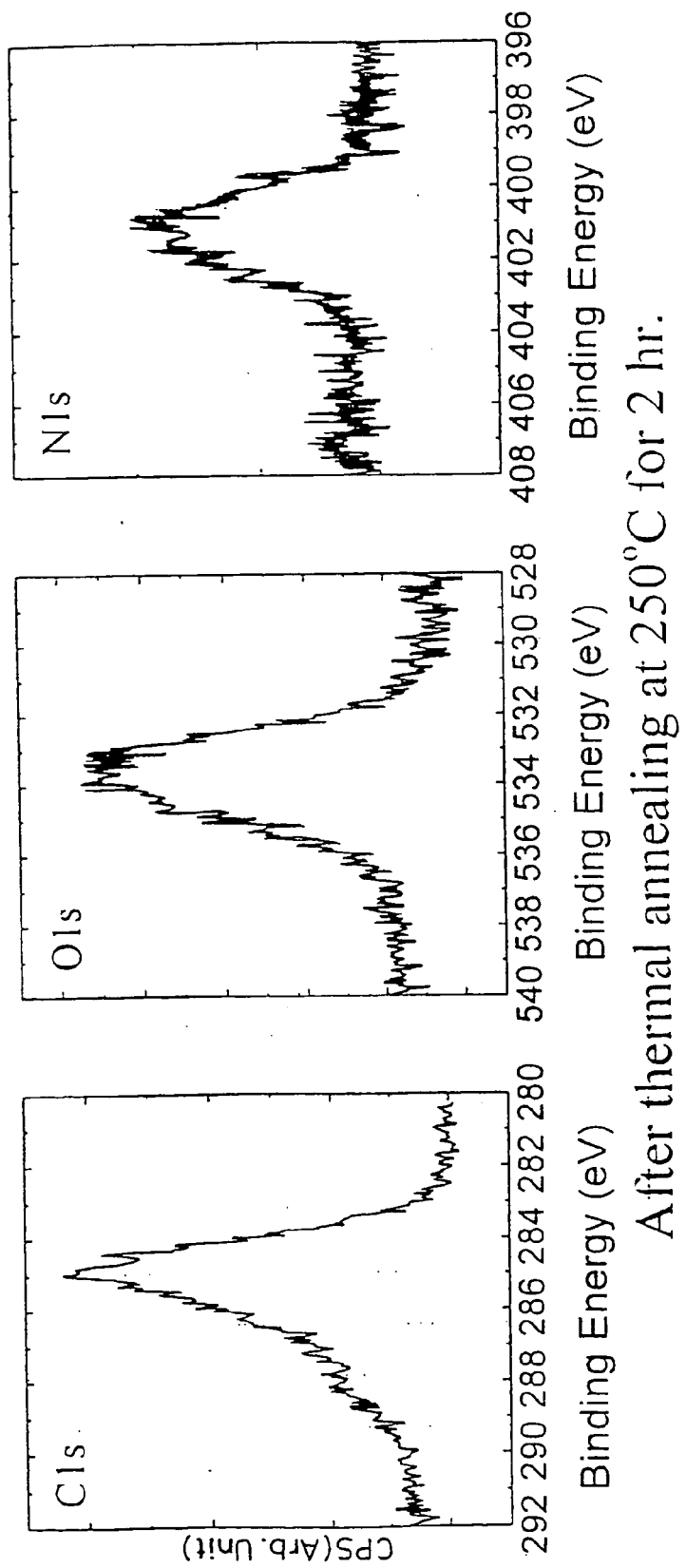
FIG. 6B is a graph illustrating the XPS spectra after annealing of the polymer in FIG. 5A.

As illustrated in FIG. 6B showing the XPS spectra after performing the annealing, the peak of oxygen or nitrogen has been little changed. However, the C1s spectral peak is much more asymmetric after the annealing. It implies that the concentration of functional groups, such as C—C, C=O or (C=O)—O has been increased by the annealing. Accordingly, considering the results of the FT-IR and XPS, the hydrophilic group concentration is increased by the annealing because the radicals which are not completely reacted during the polymerization are reacted with oxygen by the annealing in the ambient atmosphere and form the hydrophilic group, such as C—C, C=O or (C=O)—O.

Table 2 shows the composition ratios determined by using XPS of carbon, oxygen and nitrogen in a polymer obtained by depositing the polymer for 1 minute when the mixture ratio of acetylene and nitrogen was varied under the conditions of a pressure of 0.3 Torr, a current of 2 $mA/cm^2$ and a voltage of 1 kV and polymerizing the polymer at the anode according to the polymerization using the DC discharge. The amount of oxygen was little influenced by that of nitrogen, while the amount of nitrogen was dependent upon its mixture ratio. It implies that oxygen in the polymer comes from an external source. In addition, the increase in the concentration of nitrogen shows that nitrogen which is introduced in the form of mixture gas directly joins the reaction. Such a result is identical to the above-described FT-IR result that the peak intensity related with nitrogen compound increased.

TABLE 2

| Acetylene:Nitrogen | 9:1 | 1:1 | 1:9 |
|---|---|---|---|
| C | 89.72 | 77.91 | 76.07 |
| O | 10.28 | 11.97 | 11.57 |
| N | 0 | 10.12 | 12.36 |

The results of the FT-IR and XPS show that oxygen exists in the polymer and the mixture ratio of the nitrogen gas introduced during the polymerization remarkably influences the properties of the polymerized layer. Such an oxygen or nitrogen compound serves to change the properties of the polymer from hydrophobicity to hydrophilicity according to the concentration of nitrogen and oxygen. Especially, nitrogen directly joins the reaction and changes the property of the polymer.

RF Discharge

Figure 7:
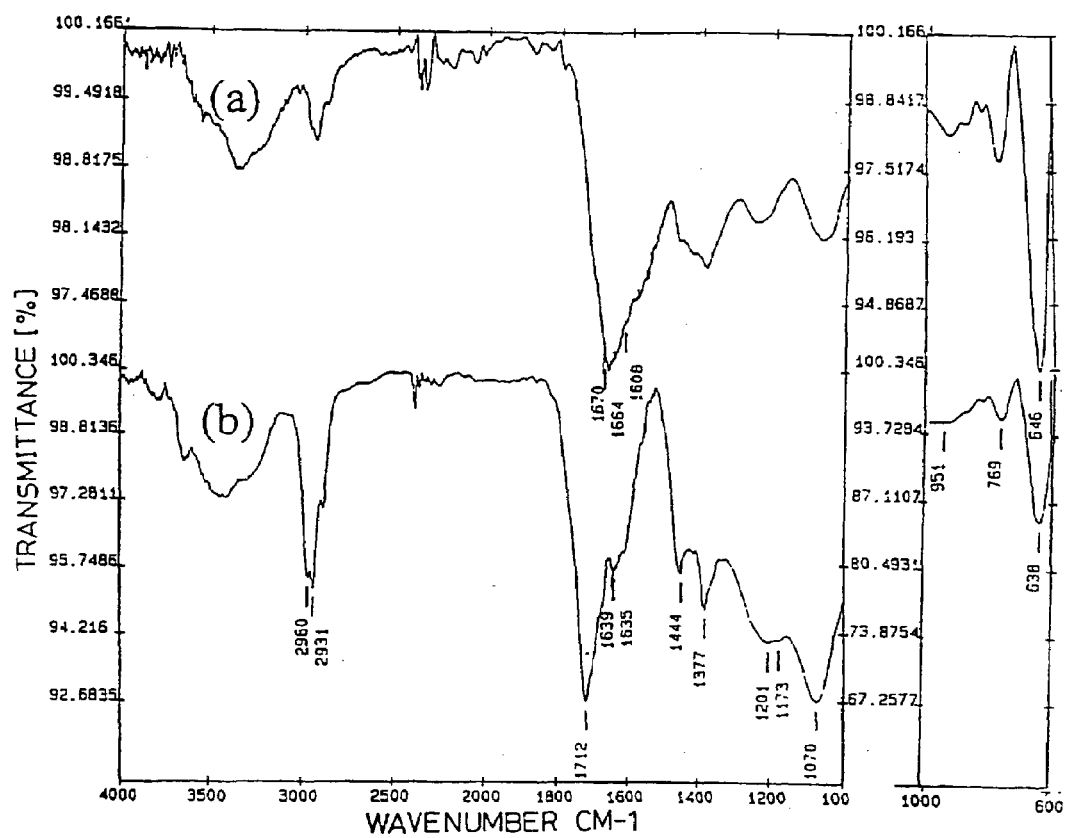
FIG. 7 is a graph illustrating the FT-IR spectra of an RF-discharged polymer on a passive electrode, when the ratio of acetylene to nitrogen is varied under the conditions of 0.3 Torr gas pressure, 200 W RF discharge power and 2 minutes process time.

FIG. 7 illustrates FT-IR spectra obtained from the polymer deposited on the passive electrode by using the RF-discharged gas mixture with varying the mixture ratio of acetylene and nitrogen. As shown therein, (a) is an FT-IR spectra obtained from a polymer deposited by RF-discharged gas mixture of acetylene (10%) and nitrogen (90%) at a total gas pressure of 0.3 Torr with the RF energy of 200 W for 2 min. The contact (wetting) angle on this film was lower than 5°. While, (b) is a FT-IR spectra of a polymer obtained under the same conditions as (a) except for the mixture ratio of acetylene (70%) and nitrogen (25%), wherein the contact (wetting) angle of the film was approximately 180°. As shown in FIGS. 2, 3, 4 and 6, the spectra of the polymers which have been obtained from plasma polymerization of acetylene, and of mixtures of acetylene and nitrogen by DC and RF discharges are quite similar to spectra which have been disclosed in the conventional art. Furthermore, as can be seen from papers such as Ivanov, S. I., Fakirov, S. H, and Svirachev, D. M. Eur. Polym. J. (1997, 14, 611), FT-IR spectra obtained from the polymer deposited by acetylene plasma and those deposited by high energy toluene plasma have similarities. Nevertheless, in general, the relative intensity of peaks of the spectra varies as the discharge power increases. Accordingly, in view of the peak intensity of the FT-IR spectra, it is shown that the polymer obtained by the plasma polymerization is strongly dependent on the discharge power.

One of the most important peaks which is shown among all of the polymers is the one shown in the vicinity of 3430 cm$^{-1}$. Particularly, a peak of 2965 cm$^{-1}$ and a relatively weak peak of 1370 cm$^{-1}$ originate from stretching and deformation vibration of a methyl group and show that a large amount-of branching developed in a plasma polymer. A peak of 1700 cm$^{-1}$ is considered to be due to vibration of a carbonyl (aldehyde or ketone). Absorption at 1630 cm$^{-1}$ corresponds to an olefin (C=C) stretching band. The existence of a CH$_2$ or CH$_3$ deforming band at 1450 cm$^{-1}$ shows that there are addition branches and crosslinking. A strong peak at 1100 cm$^{-1}$ is caused by a COC asymmetric stretching of aliphatic ether or a C—O stretching of saturated ether. A band portion between 900 cm$^{-1}$–600 cm$^{-1}$ shows CH deformation of substituted benzene.

Further, a surface contact angle of a substrate obtained from the RF discharge was between 5°–180° and by adjusting the ratio of acetylene and nitrogen the polymer can be made highly hydrophilic or hydrophobic.

The FT-IR spectra obtained from the film deposited by an acetylene-nitrogen RF plasma shows an N—H stretch, primary amine, dialkyl amine, and an amino-like property. Hydroxyl and carbonyl stretches bands and an N—H stretch and an N—H band appeared at a similar region. Since these band generate wide and strong signals, it is impossible to separate the oxygen compound signal from these band regions. In accordance with quantitative analysis, the amount of oxygen remaining in the acetylene-nitrogen plasma polymer is found to be the same as that of an acetylene polymer, which means that the acetylene-nitrogen polymer is instantly oxidized by exposing it to the ambient atmosphere. That is, the peak intensity of carbonyl increased upon exposing the substrate to the ambient atmosphere. Although the absorption effect of a hydroxyl group is not clearly shown, it is likely to be caused by coincidence of the stretching band absorption of O—H and N—H. However, a possibility of coexistence of amide and a hydroxyl or carbonyl group should not be excluded. In reality, an absorption band is considerably wide and difficult to find, and overlapped peaks are similar to some degree. When nitrogen and oxygen are combined in the same ratio, a polymer which is discharged thereby is similar to amine. Accordingly, the deposited polymer has many branches and when the film is exposed to the atmosphere, or when the substrate thereof is heat-treated, the polymer reacts with oxygen and thereby it reduces the time required to react with oxygen.

In XPS, nitrogen and oxygen signals appeared at 401 eV (N1s) and 533 eV (O1s), respectively. Table 3 shows the relative ratio of carbon, nitrogen and oxygen which is calculated from the intensity of N1s, O1s and C1s (BE=286 eV) signals, while Table 4 shows O1s binding energy depending on the O1s chemical state. Although the polymer is deposited by using a plasma which does not contain oxygen, it is common that deposited polymer contains oxygen compounds and this oxygen is added into the polymer during or after the treatment of a plasma. Therefore, it seems that a radical intermediate serves an important role in the plasma treatment. Because such radical is unstable, it is reacted with other gases and also in heat-treatment, the radical is rapidly reacted with oxygen (peroxy radical formation). This means that oxygen is not needed inside of the plasma to form a hydrophilic polymer, however a small amount of oxygen in the plasma enables a surface to be treated to have high affinity for the plasma. After the plasma treatment, the radical at the surface will react with oxygen under normal atmospheric conditions.

TABLE 3

The ratio of an elementary synthesis of acetylene-nitrogen to carbon(100%) of a surface polymer obtained by RF discharge.

| gas mixture ratio | RF energy | nitrogen | oxygen |
|---|---|---|---|
| acetylene(10%)-carbon(90%) | 200–300 Watt | 12.6 | 18.5 |

TABLE 4

O1s binding energy according to the XPS

| C=O | | 531.93 eV |
|---|---|---|
| C—O | ΔE = about 1.2 eV | 533.14 eV |

Figure 8:
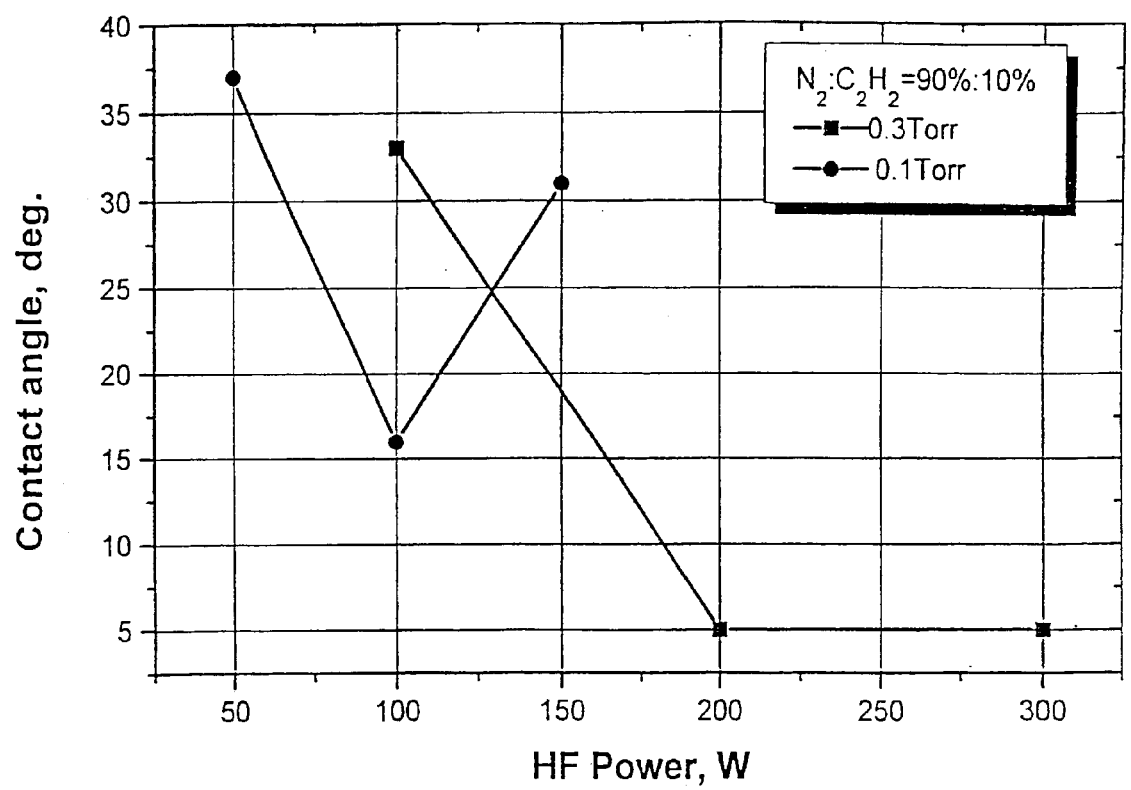
FIG. 8 is a graph illustrating the change in the water-drop contact (wetting) angle on an Al substrate having a polymerized surface when the RF power is varied under the conditions that the ratio of nitrogen to acetylene is set to be 9:1 and the gas pressure is fixed during the RF discharge.

FIG. 8 shows the change in contact angle under conditions where the ratio of nitrogen and acetylene is fixed at 9:1 and the gaseous pressure and RF power are varied, wherein when the gas pressure is 0.3 Torr and the RF power is over 200 W, the contact angle is 5° which shows desirable hydrophilicity.

Figure 9:
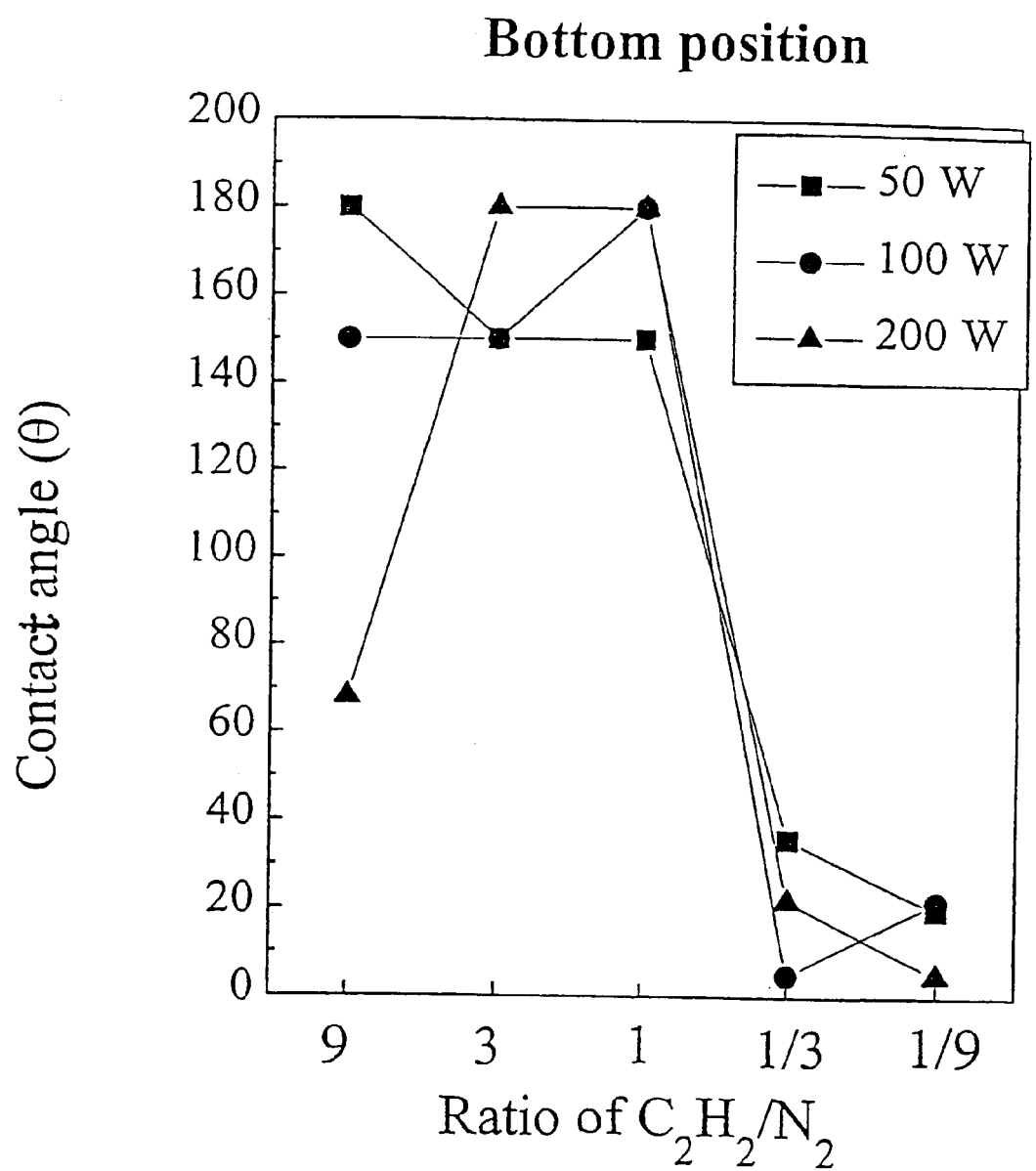
FIG. 9 is a graph illustrating the change in the contact (wetting) angle when the discharge power and the ratio of acetylene to nitrogen are varied.

While, FIG. 9 shows the change in contact angle when varying discharge power and the ratio of acetylene and nitrogen in the RF discharge. As shown therein, the contact angle is 180° showing desirable hydrophobicity when the ratio thereof is 9:1, while the contact angle is lower than 5° showing the desirable hydrophilicity when the ratio thereof is 1:9. Thus, it is possible to modify the surface of a metal to be hydrophilic or hydrophobic by adjusting the ratio of acetylene and nitrogen. The results thereof are shown in Table 5.

Accordingly, it is considered that a polymer layer according to the present invention can be deposited without any difficulty to ceramic and polymer materials to fix on a passive electrode, besides a metallic material which may be applied to an anode of a DC discharge.

TABLE 5

The contact angle of a high polymer under conditions of the position of a substrate in a vacuum chamber, gas ratio and RF power.

| | bottom | middle | top |
|---|---|---|---|
| acetylene(90%): 0.27 Torr, nitrogen(10%): 0.03 Torr | | | |
| 20 W | 71° | 75° | 68° |
| 50 W | 180° | 67° | 82° |
| 100 W | >150° | 72° | 66° |
| 200 W | 68° | 75° | 78° |
| acetylene(75%): 0.225 Torr, nitrogen(25%): 0.075 Torr | | | |
| 50 W | >150° | 76° | 71° |
| 100 W | >150° | 80° | 72° |
| 200 W | 180° | 116° | 95° |
| acetylene(50%): 0.15 Torr, nitrogen(50%): 0.15 Torr | | | |
| 50 W | >150° | 70° | 61° |
| 100 W | 180° | >150° | 70° |
| 200 w | 180° | 70° | 72° |
| acetylene(25%): 0.075 Torr, nitrogen(75%): 0.225 Torr | | | |
| 50 W | 36° | 23° | 36° |
| 100 W | <5° | 50° | 53° |
| 200 W | 22° | 402° | 64° |

TABLE 5-continued

The contact angle of a high polymer under conditions of the position of a substrate in a vacuum chamber, gas ratio and RF power.

| | bottom | middle | top |
|---|---|---|---|
| acetylene(10%): 0.03 Torr, nitrogen(90%): 0.27 Torr | | | |
| 50 W | 20° | 47° | 32° |
| 100 W | 22° | 47° | 98° |
| 200 W | <5° | 58° | 68° |

Test Results of Deposited Polymer

FIGS. 10A and 10B are SEM (scanning electron microscopy) images of a deposited polymer surface which exhibits hydrophilicity among films deposited by the DC plasma polymerization, wherein the surface of the polymer has a velvet-like texture which is considered to enable the surface to have hydrophilicity.

Figure 11:
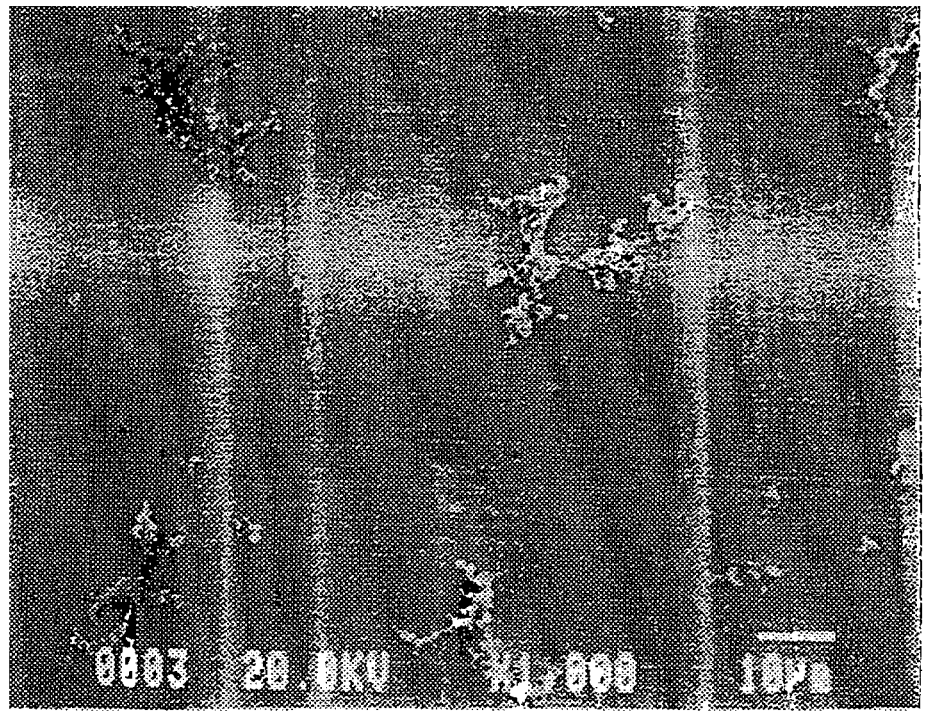
FIG. 11 is an SEM micrograph illustrating the surface of a polymer with hydrophobicity among the polymers polymerized by the DC discharge photographed by a scanning electron microscope.

FIG. 11 is a SEM image of a deposited polymer surface which exhibits hydrophobicity among films deposited by the DC plasma polymerization, wherein it shows formation of relatively large bumps by which soft particles are combined onto solid particle groups and it is considered that the bumps might affect the hydrophobicity.

In addition, FIG. 12A is an SEM image of the film which is processed to the hydrophilic polymer by the RF discharge and FIG. 12B is its enlargement. As can be seen therein, although the surface of the substrate looks different from the result of the DC discharge case in FIGS. 10A and 10B, the surface of the polymer has a kind of velvet-like texture which is also considered to enable the surface to have hydrophilicity.

Figure 13:
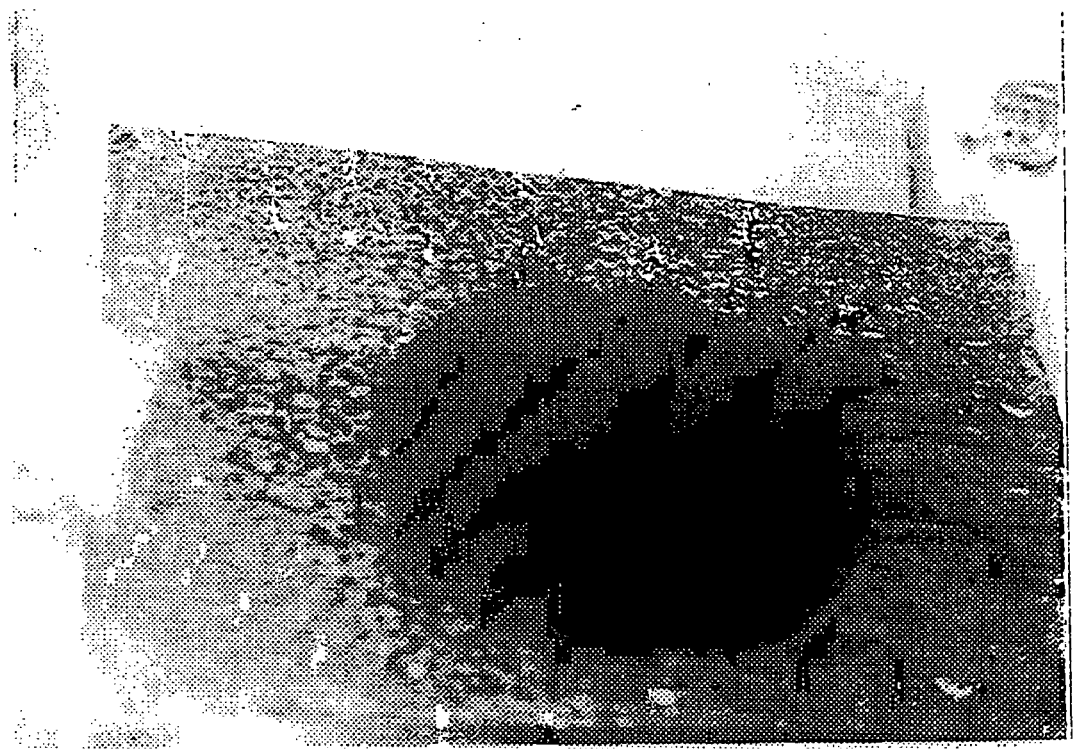
FIG. 13 illustrates the water spray property of an Al sheet processed according to a first embodiment of the present invention.

FIG. 13 shows a water spray result of an Al sheet which has been treated according to the present invention. As shown therein, the area within the circle is a portion which has been treated according to the present invention, showing a good water spreading property due to a low-degree contact angle of a water droplet, while the other area thereof which has not been treated has a high-degree contact angle, whereby water-drops form without being spread. One of the important results is that the above described characteristic does not change with the lapse of time, which means that the formed hydrophobic group does not wash out by water. That is, the molecular weight of the synthesized polymer is considerably large.

Figure 14:
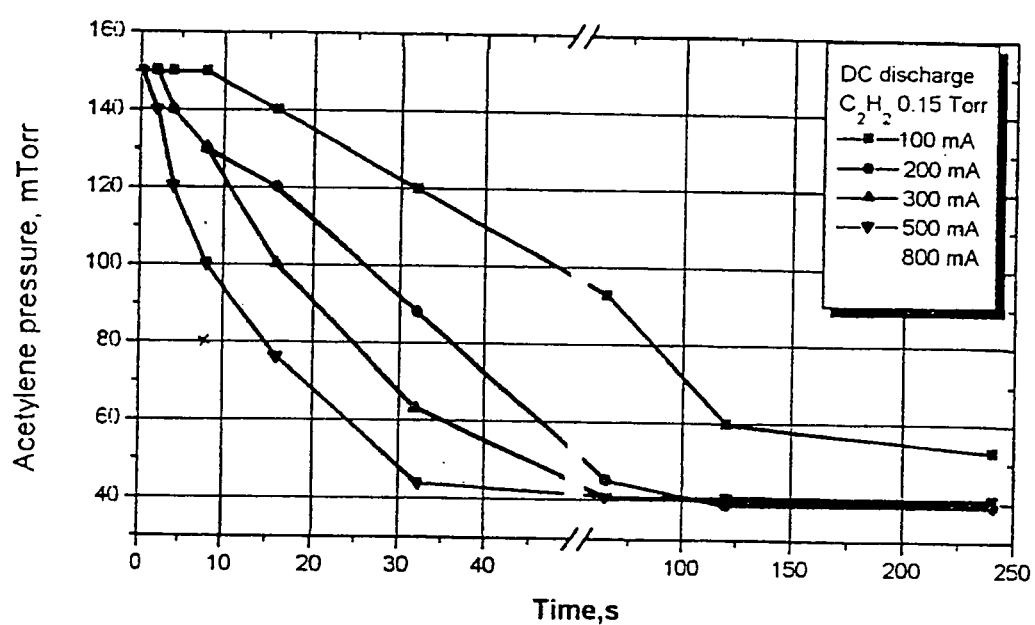
FIG. 14 is a graph illustrating the pressure change of Acetylene in the vacuum chamber when a plasma is DC-discharged under various conditions after an initial pressure is set to 0.15 Torr.

FIG. 14 shows changes in acetylene pressure by the DC discharge when acetylene was blown into the vacuum chamber until the chamber pressure reached to 0.15 Torr and then pumping and supplement of acetylene was stopped. Here, it is noted that only the discharge current was varied without providing acetylene during the DC discharge. As shown therein, within a short period, the acetylene pressure was reduced to 40 mTorr at the minimum in accordance with the increase in the DC current. The reason for decrease in the pressure is that the polymer is deposited onto the substrate and onto an inner wall of the chamber from acetylene radicals and ions. Here, since the acetylene pressure rapidly decreases as the current increases, it is shown that the more the current increases, the faster the synthesizing of the polymer is performed.

Figure 15:
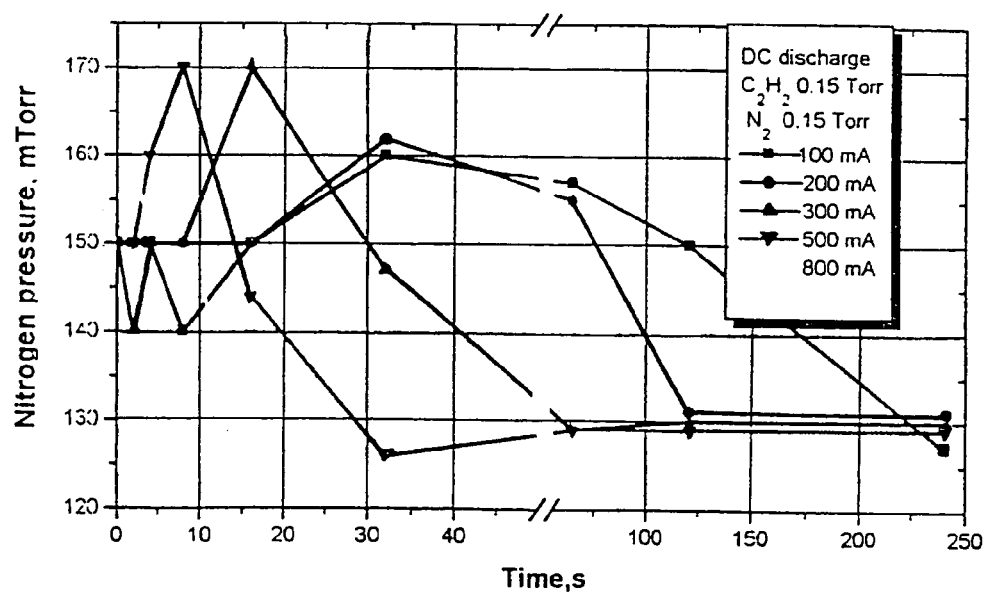
FIG. 15 is a graph illustrating the total pressure change with the lapse of time after acetylene and nitrogen are mixed at a ratio of 50:50 in the vacuum chamber, the pressure is set to 0.3 Torr, and a DC discharge is started under various conditions.

FIG. 15 shows the changes in total pressure by the DC discharge under the same condition as in FIG. 14 except the gas mixture ratio. The gas mixture ratio of acetylene and nitrogen was 1:1. As shown therein, when mixing acetylene and nitrogen, the pressure rapidly increases initially but with the lapse of time the pressure gradually decreases. Here, the nitrogen pressure increases due to nitrogen dissociation, and the nitrogen pressure again decreases due to nitrogen incorporation. Further, as the DC current increases, the dissociation time of nitrogen gas is reduced. As shown in FIG. 15, maximum values of the nitrogen pressure shift toward the left side thereof which means the time lapsed is relatively shorter. However, the decrease in the nitrogen pressure after the maximum value is reached is caused by the reduction of acetylene and nitrogen due to the polymerization onto the substrate. Thus, it is shown that a certain time is required for the polymerization, the polymer is damaged by the plasma after the required time is lapsed, and a large amount of polymer can be produced when the synthesis is accomplished within an optimum time.

Figure 16A:
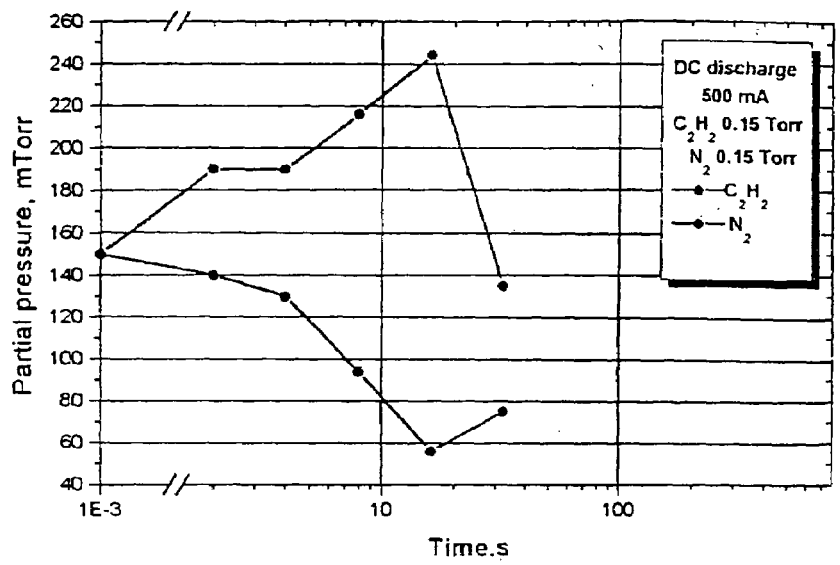
FIG. 16A is a graph illustrating the partial pressure changes of the each of acetylene and nitrogen with the lapse of time after acetylene and nitrogen are mixed at a ratio of 50:50 in the vacuum chamber, the pressure is set to 0.3 Torr, and a DC discharge is started at 500 mA.
Figure 16B:
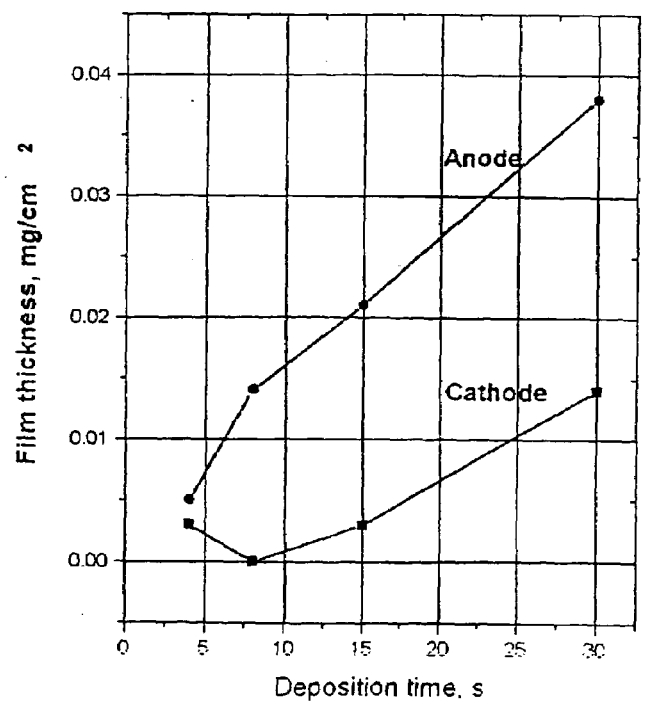
FIG. 16B is a graph illustrating the thickness change of a polymer polymerized onto the anode and cathode with the lapse of time after acetylene and nitrogen are mixed at a ratio of 50:50 in the vacuum chamber, the pressure is set to 0.3 Torr, and a DC discharge is started under various conditions.
Figure 16C:
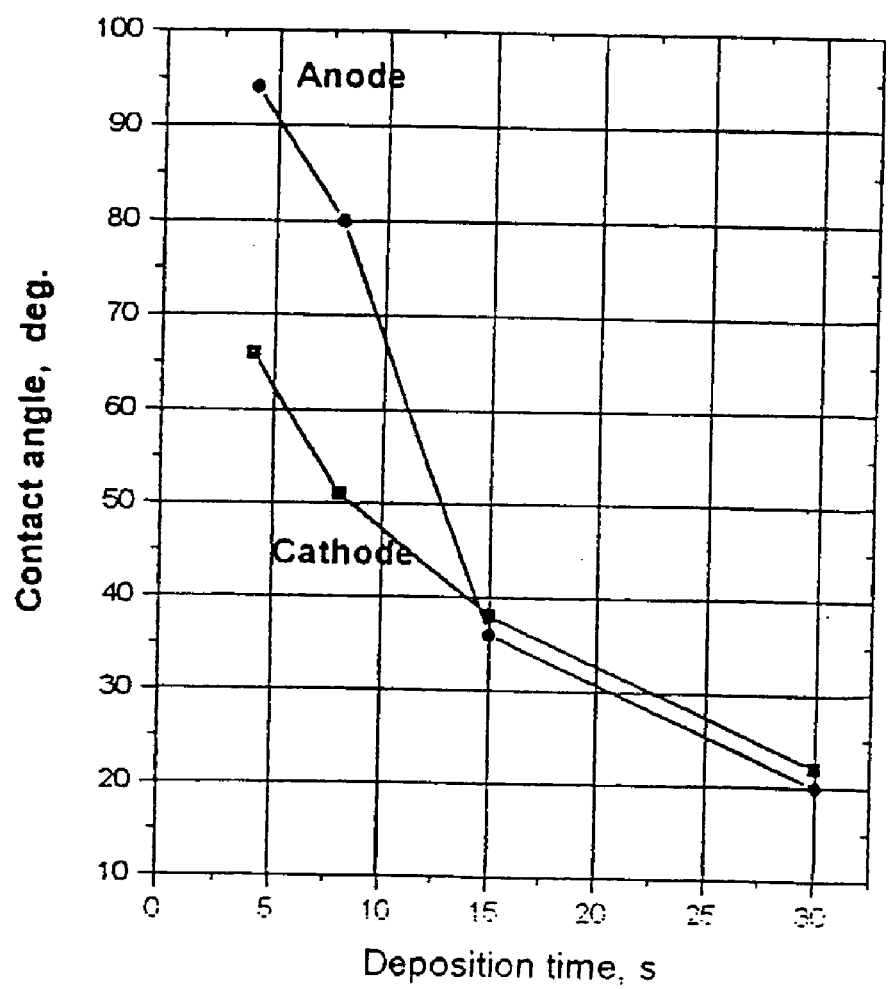
FIG. 16C is a graph illustrating the contact (wetting) angle change of a polymer with the lapse of time after acetylene and nitrogen are mixed at a ratio of 50:50 in the vacuum chamber, the pressure is set to be 0.3 Torr, and a DC discharge is started under various conditions.

In FIG. 16A, it is shown that the nitrogen pressure increase and the acetylene pressure decreases. FIG. 16B shows the thickness of the polymer according to the discharge time, wherein the thickness thereof under less than 5 sec of discharge time can be ignored since a sputtering effect of an aluminum substrate is greater than a deposition rate of the polymer. The result means that nitrogen is dissociated and then polymerization occurs and at least 5 seconds are required for the deposition of the polymer. Next, as the discharge time lengthens, the thickness of the polymer increases. As shown in the result of FIG. 14, since the acetylene pressure is reduced to the minimum point at 60 sec, the thickness of the polymer no longer increases. Thus, as the acetylene pressure becomes reduced, the deposition rate of the polymer decreases, and when the deposition time is 100 sec, the thickness of the polymer is gradually reduced due to the sputtering effect. Further, FIG. 16C shows that a contact angle of water under 20° after 30 sec of deposition time, which means that there exists an optimum deposition time. The concentration ratio of nitrogen and acetylene into the synthesized polymer can be estimated from the initial and end pressures of acetylene and nitrogen. According to the estimation, nitrogen(20%) and acetylene(100%) are reacted at 100 sec.

Figure 17A:
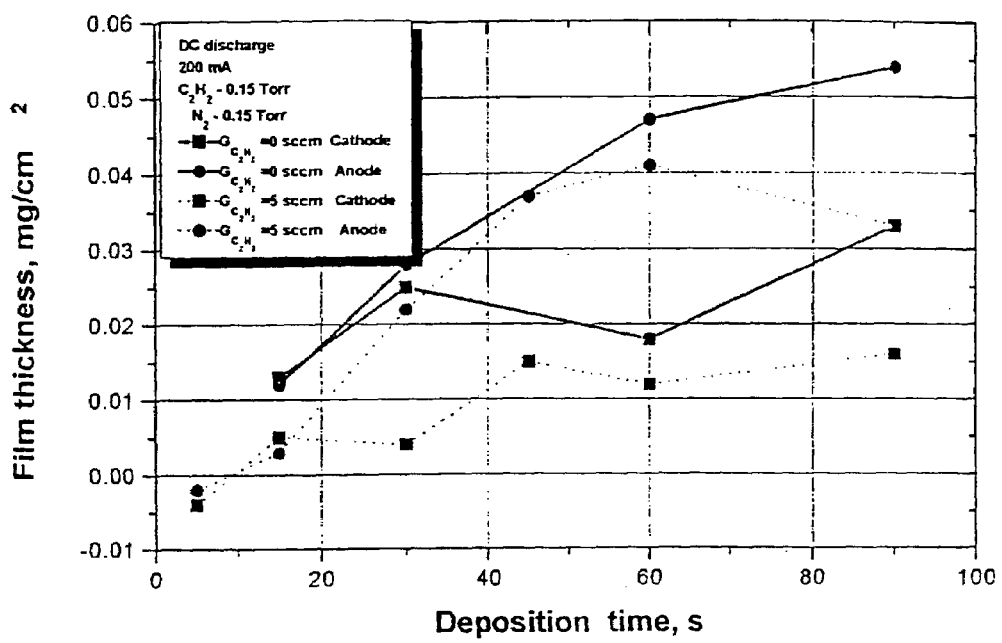
FIGS. 17A and 17B are graphs respectively illustrating the change of thickness and contact (wetting) angle of the polymer with the lapse of the DC discharge time, wherein the solid lines and dashed lines represent respectively characteristics of the deposited film with and without adding acetylene gas (5 sccm)
Figure 17B:
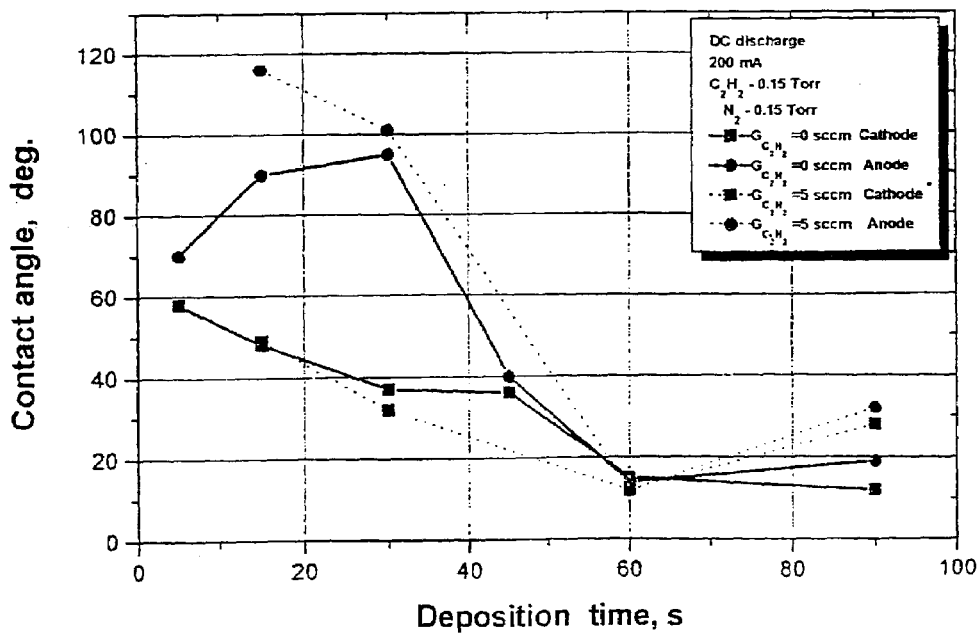

FIGS. 17A and 17B show the reaction of nitrogen which is dissociated in the vacuum chamber and acetylene which is additionally flowed into the chamber, when 5 sccm acetylene is added at a cathode and an anode after the polymer synthesis of $C_2H_2$ and $N_2$ is completed under the conditions in FIGS. 16A through 16C. The synthesized polymer before additionally flowing acetylene into the chamber is synthesized to the substrate with the lapse of a certain time and thus the thickness thereof increases. However, after 60 sec, the thickness thereof no longer increases and instead it is reduced. In addition, when acetylene is flowed to the thusly synthesized substrate and reaction of acetylene to remaining nitrogen is observed, the thickness of the polymer which is synthesized to the substrate is reduced from the thickness thereof before adding is acetylene. In other words, the attempt to polymerize the remaining nitrogen and the additionally flowed acetylene after the reaction thereof damages the organic polymer which has been already deposited and reduces the thickness of the originally synthesized matter. FIG. 17B shows the change in contact angle in accordance with the deposition time, wherein the cathode and the anode have the lowest values at 60 sec at which the gaseous pressure becomes the minimum value. Accordingly, it is the most desirable when the DC discharge polymerization is accomplished at around 60 sec. Of course, such polymerization time may vary in accordance with conditions such as current and voltage of the DC discharge, the RF voltage, etc. When the discharge is performed for over 60 sec, the polymer is worn due to the sputtering effect, which results in increase in the contact angle. As can be seen in FIGS. 17A and 17B, when introducing acetylene into the chamber during the discharge polymerizing process, the thickness of the polymer increases, however the contact angle thereof decreases when the polymerization time is over 60 sec.

Figure 18A:
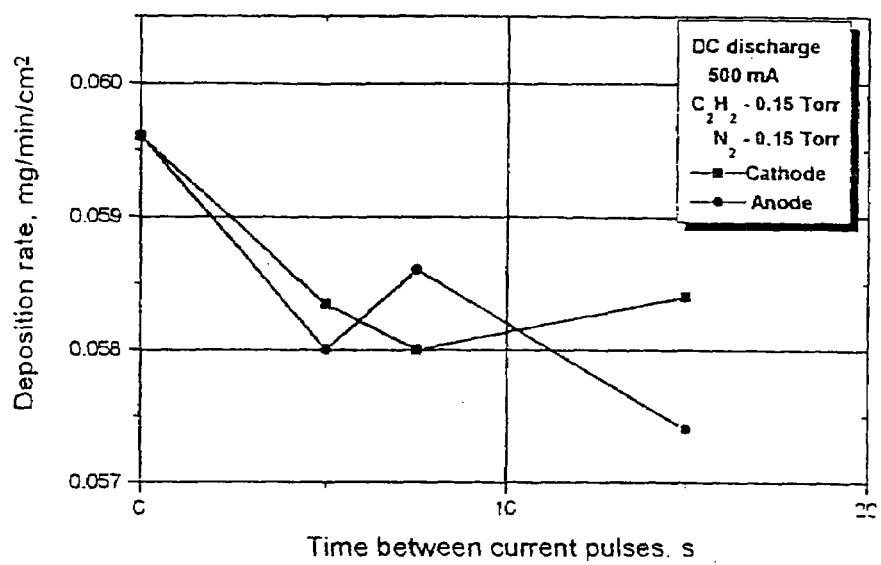
FIGS. 18A and 18B are graphs respectively illustrating the change in deposition rate and contact (wetting) angle of the polymer with the time between current pulses of the DC discharge.
Figure 18B:
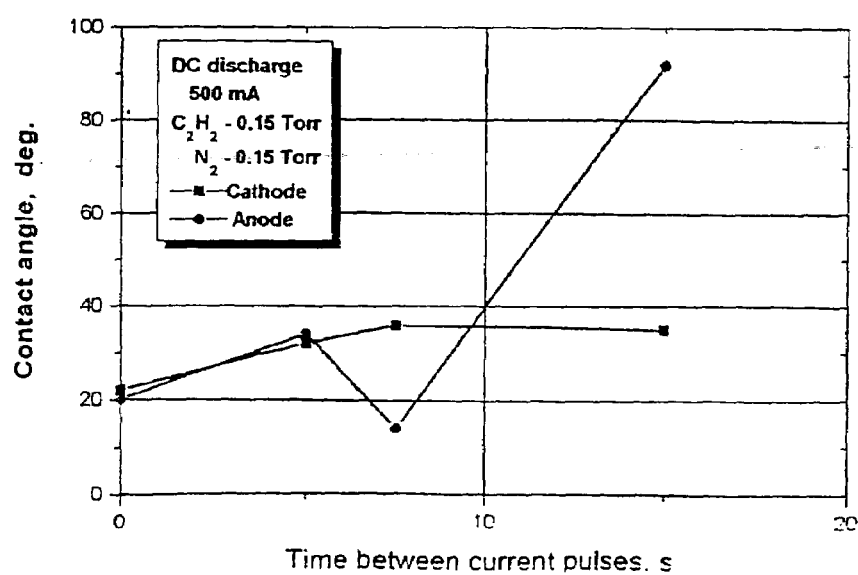

FIGS. 18A and 18B show the change in deposition rate and contact angle of polymers which are obtained from a cathode and an anode, by equalizing the treating time and cooling time, that is, by performing an on/off treatment for the cathode and anode in a pulse type. Here, it is noted that the total treatment time is 30 sec. As shown in FIG. 18A, when treating for 30 sec without having a cooling period, the cathode and anode have the highest deposition rate, while as the treating time decreases, the contact angle decreases as shown in FIG. 18B. Judging from this, it is found that there exists the optimum treatment time and radicals and negative and positive ions are important factors for the polymerization.

Figure 19:
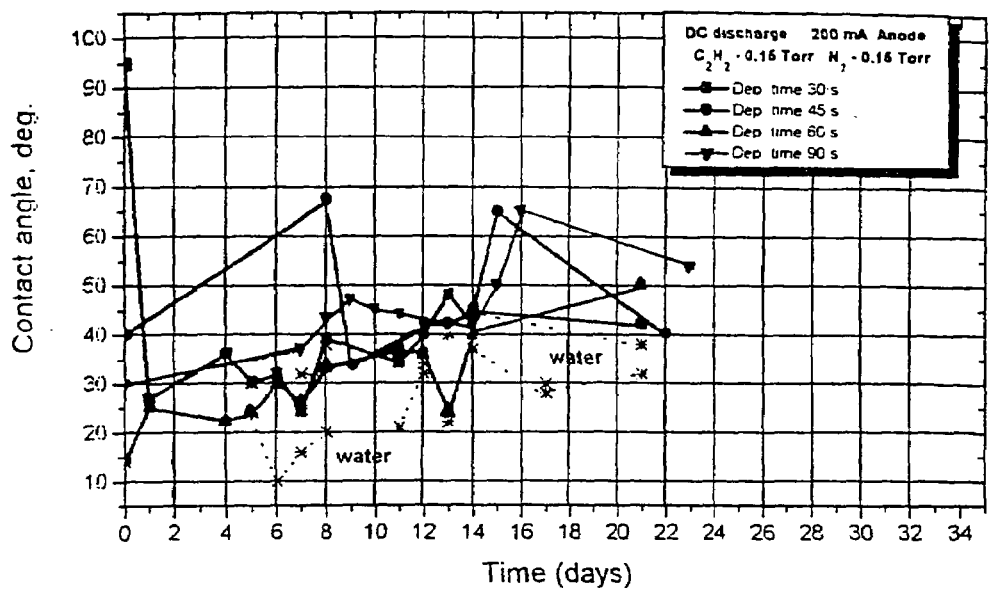
FIG. 19 is a graph illustrating a change of contact angle of the polymer with the lapse of the time at various conditions.

FIG. 19 is a graph showing the change in contact angle of the polymer obtained under each condition when exposed to the atmosphere and the change in contact angle of the polymer substrate when placed in water for a period of time and then dried with dry $N_2$. When exposing the polymer to the atmosphere, the contact angle thereof gradually increases, while when placing the polymer substrate in water, the contact angle little changes. Accordingly, it seems that the hydrophilic radical polymerized to the substrate rotates, and when contacted with water, the hydrophilic radical turns outwardly and thus maintains the hydrophilicity on a surface of the substrate, while when not being contacted therewith, the hydrophilic radical turns inwardly and appears not to maintain the hydrophilicity.

Measurement of Dynamic Contact Angle

Generally, whether a surface of a material has hydrophilicity or hydrophobicity is determined by the measurement of a contact angle between a water and the surface thereof. Such contact angle is divided into a static contact angle and a dynamic contact angle. The static contact angle is measured by dropping a water droplet of 0.01 cc onto the surface of a specific material and thereby measuring the diameter of the water droplet which has been spread out on the surface thereof. Here, if the diameter is greater than 8.0 mm, it is considered that the surface of the material has excellent hydrophilicity.

Figure 20:
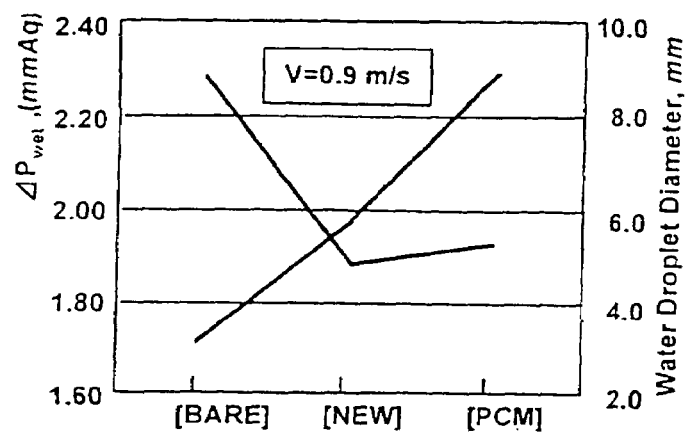
FIG. 20 illustrates a water droplet diameter and a value of pressure loss on a non-surface-modified aluminum sheet (bare), an aluminum sheet which has been surface-modified according to the present invention (present), and a conventional PCM-coated aluminum sheet (PCM)

To evaluate the hydrophilicity of the surface of a metallic material onto which a polymer has been polymerized according to the present invention, the inventors measured the static contact angle of each of a bare aluminum sheet without any surface-treatment, an aluminum sheet a surface of which had been treated according to the present invention and an inorganic coat-treated aluminum sheet (PCM), and the results thereof are shown in FIG. 20. As shown in FIG. 20, the diameter of water-spread on the bare aluminum sheet was only about 3 mm, so that the water droplet lodged between the bare untreated fins of a heat exchanger and thus obstruct air flow, which results in an increase in pressure loss, and since, in the PCM, the water-spread diameter was 9 mm meaning that the static contact angle is relatively large, a water droplet generated between the PCM-treated fins of a heat exchanger would smoothly flow and thus the pressure loss is reduced. While, on the aluminum sheet the surface of which had been treated according to the present invention, although the water-spread was about 6 mm, showing that the static contact angle was smaller than that of the PCM, the pressure loss was lower than the PCM.

From the above result, the inventors realized that the measurement of the static contact angle was insufficient in order to evaluate the hydrophilicity of the metal which had been surface-treated according to the present invention. In other words, as described above, the hydrophilic radical of the polymer polymerized onto the surface of the metal according to the present invention which seems to rotate turns outwardly and thus maintains the hydrophilicity on the surface of the sample substrate, when contacted with water.

Figure 21:
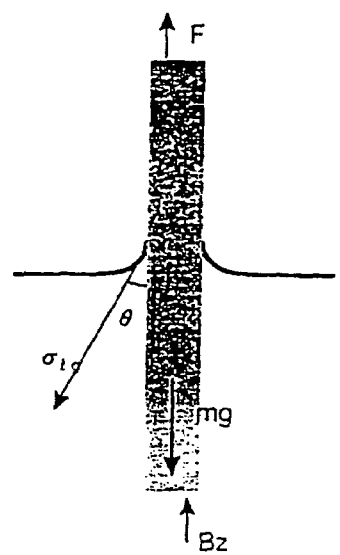
FIG. 21 schematically illustrates a measurement principle of a dynamic contact angle.

The dynamic contact angle is a contact angle which is produced between water and a sample by a surface tension on the surface of the sample in the process of immersing the sample into the water at a static-condition speed and then taking the sample out of the water. Here, it is noted that a dynamic contact angle which is measured while the sample is being immersed into the water is an advancing contact angle, and a dynamic contact angle measured while the sample is being taken out of the water is a receding contact angle, which are schematically shown in FIG. 21.

A heat exchanger may practically always be in a wet condition, since moisture is condensed while a liquid refrigerant and air are being heat-exchanged and condensed water is generated. Accordingly, in evaluating the contact angle, to apply the receding contact angle more closely approximates to using the fins of the heat exchanger.

Figure 22A:
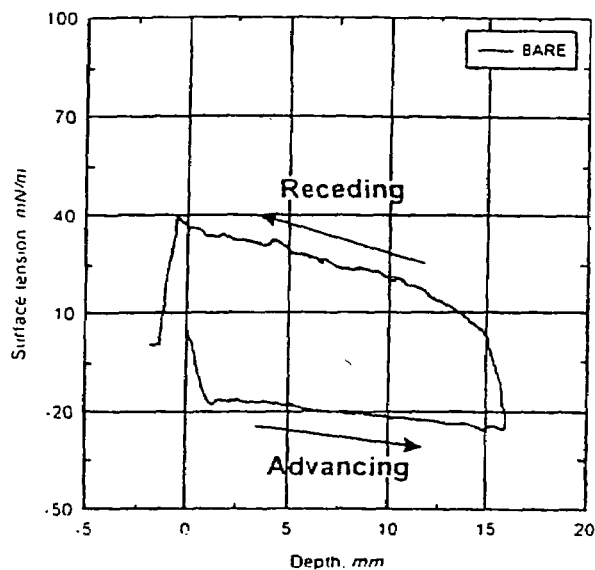
FIGS. 22A to 22C illustrate results of measuring the surface energy of the aluminum sheet which was not surface-modified (bare), the aluminum sheet which was surface-modified according to the present invention (present), and the conventional PCM is coated thereon, respectively.
Figure 22B:
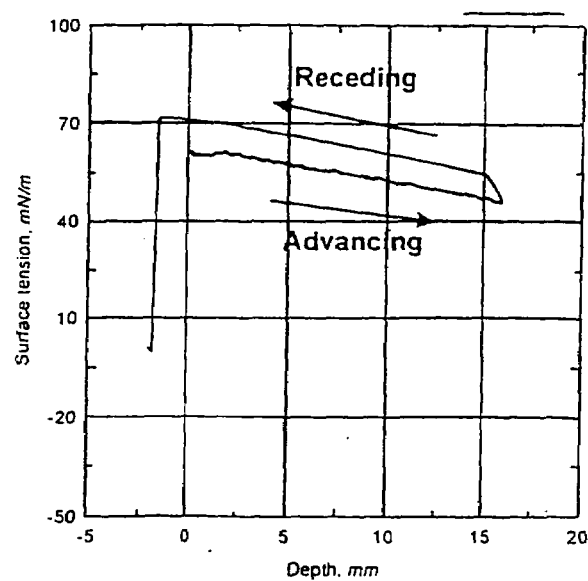
Figure 22C:
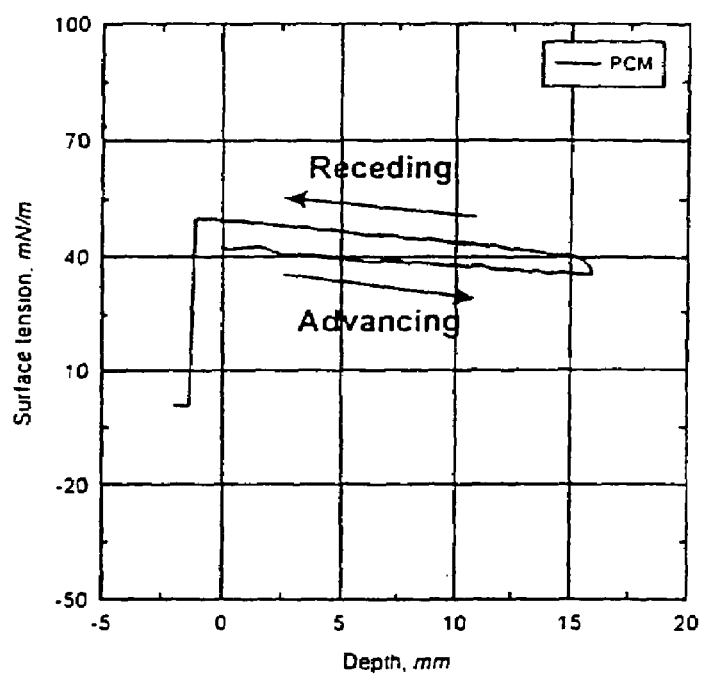

The dynamic contact angle is determined by surface tension ($\delta_{lg}$) which acts upon an interface between the water and air. Here, as the surface tension becomes small, the dynamic contact angle becomes large and the hydrophilicity worsens, while as the surface tension becomes large, the dynamic contact angle becomes small and the hydropilicity improves. FIGS. 22A, 22B and 22C show surface tension measuring results with respect to the bare aluminum sheet, the aluminum sheet which had been surface-treated according to the present invention and the conventional PCM, respectively. In FIG. 22A, the bare aluminum sheet has a surface tension which is under 0 in the advancing process and a tension at about 40 mV/m in the receding process, which shows the poor hydrophilicity. As shown in FIG. 22B, when the aluminum sheet which has been surface-treated according to the present invention is immersed into the water (the advancing process), the surface tension is low and thus the hydrophilicity becomes worse, but in the receding process which reflects the wet condition, the surface tension is over 70 mN/m which is similar to the surface tension of water, that is 72.8 mN/m. In FIG. 22C, and the PCM treated sample shows a surface tension of about 50–60 mN/m in both the advancing and receding processes. Accordingly, the surface-treated material according to the present invention has a surface tension in the wet condition which is the closest to the surface tension of water.

Figure 23:
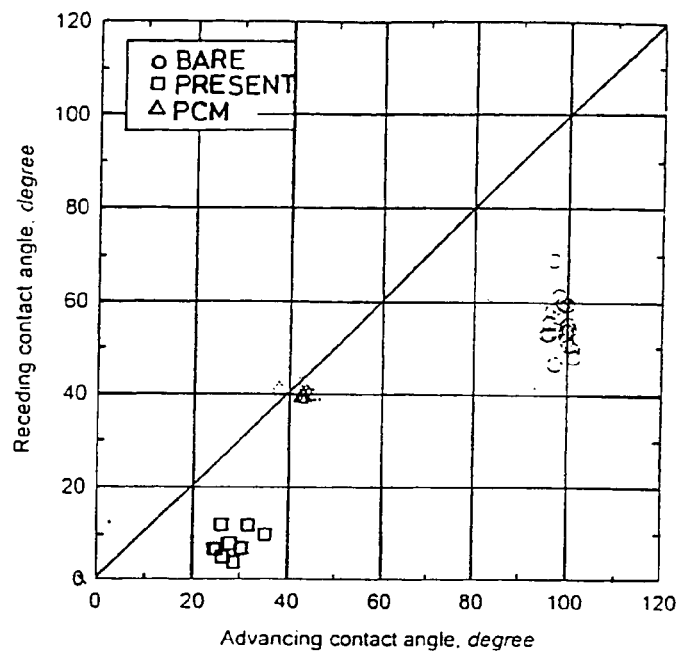
FIG. 23 illustrates a distribution of the dynamic contact angle measured in each material in FIGS. 22A to 22C.
Figure 24:
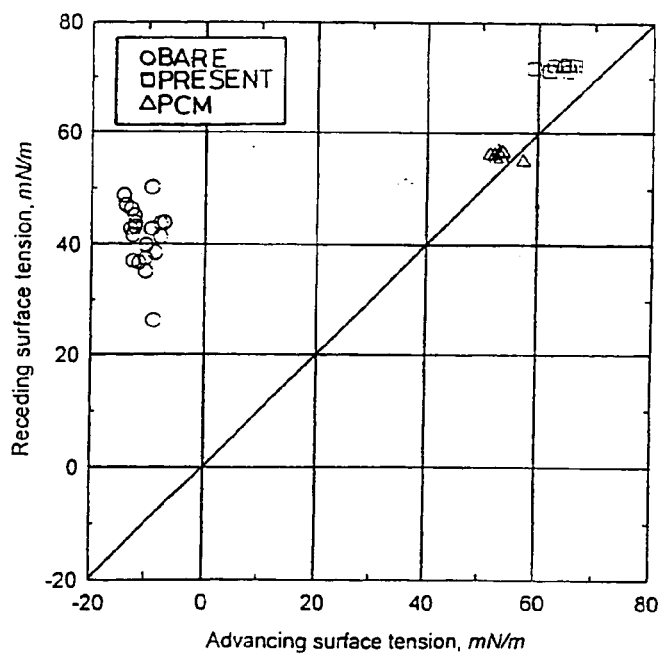
FIG. 24 illustrates a distribution of values of the surface tension measured in each material in FIG. 23.

FIGS. 23 and 24 show results of dynamic contact angle and surface tension, respectively, with respect to at least ten bare aluminum sheets, aluminum sheets which have been surface-treated according to the present invention and conventional PCMs, respectively. According to FIG. 23, the bare aluminum sheets which have advancing contact angles at about 100° exhibit inferior hydrophilicity, the PCMs exhibit advancing and receding contact angles at about 40° C. and the surface-treated aluminum sheets according to the present invention exhibit advancing contact angles at 60° which is inferior to the PCMs and receding contact angles at about 10°, showing the excellent hydrophilicity. Further, in FIG. 24 illustrating the result of a surface tension test, the surface-treated aluminum sheets have receding contact angles over 70 mN/m which are more similar to the surface tension of water, compared to the PCMs of which the receding contact angles are about 60 mV/m.

As a result, it is demonstrated that the surface-treated metal according to the present invention has even more excellent hydrophilicity in the wet condition.

Aging Test

Figure 25A:
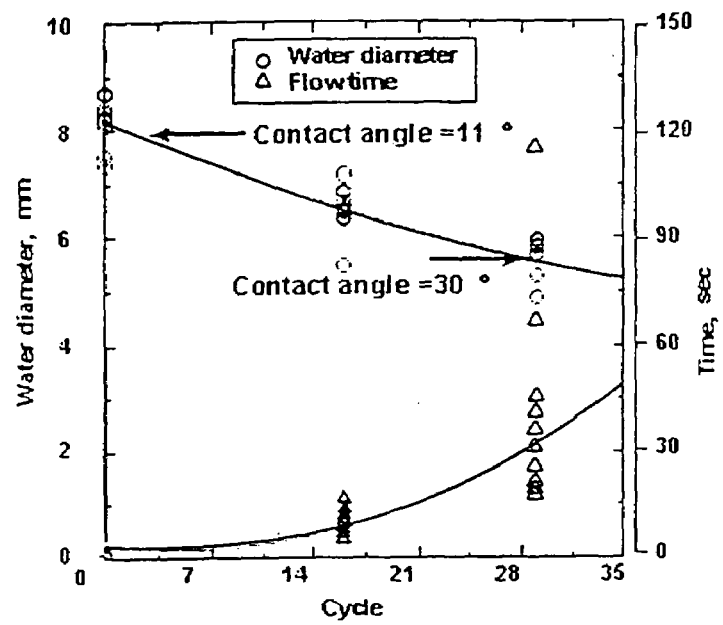
FIG. 25A illustrates an aging experimental result of the PCM.
Figure 25B:
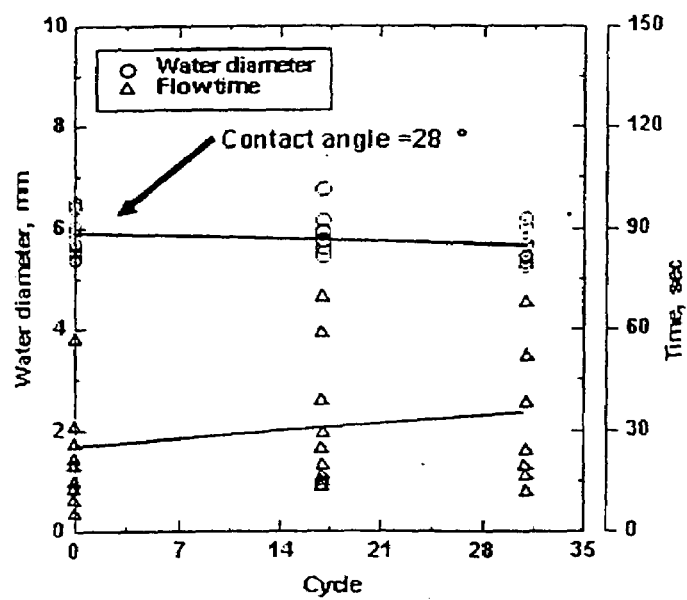
FIGS. 25B to 25E illustrate the aging experimental result of the aluminum sheet which has been surface-modified according to the present invention.
Figure 25C:
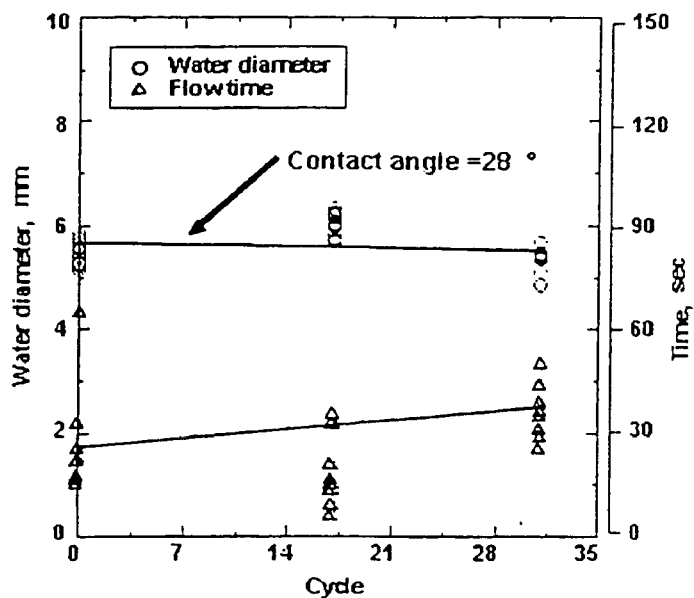
Figure 25D:
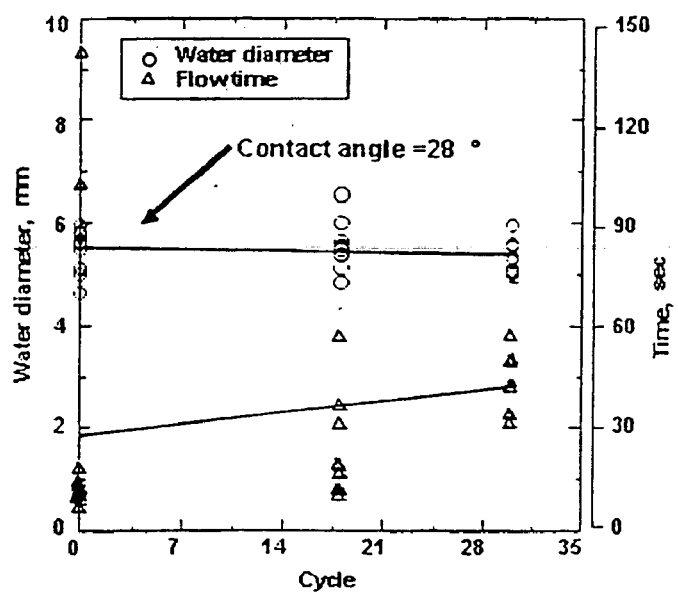
Figure 25E:
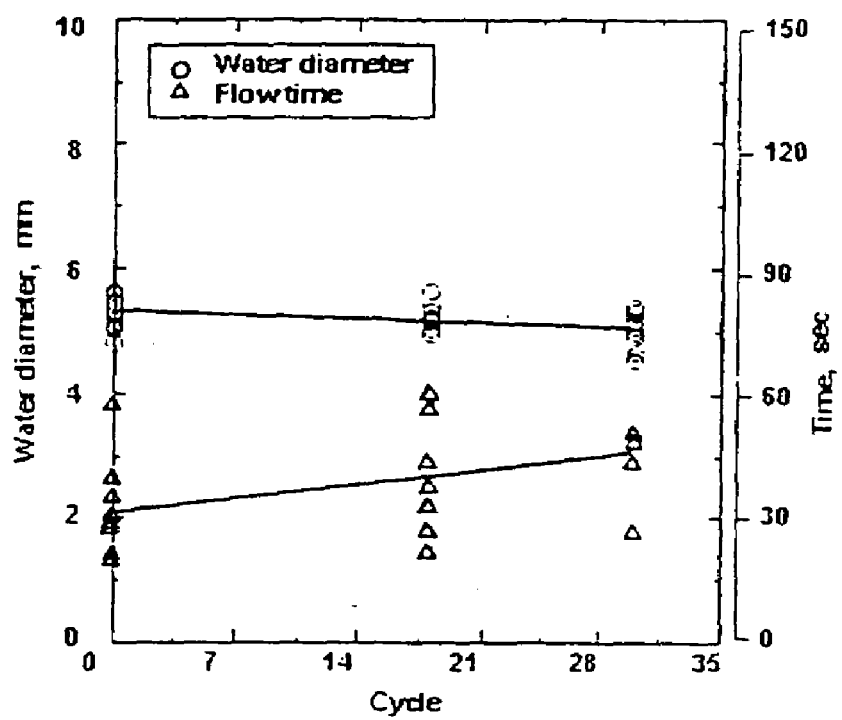

The aging test was performed with respect to the conventional PCM and the surface-treated aluminum sheet according to the present invention for 35 cycles, each cycle including a 1 hour wet test and a 1 hour dry test. As shown in FIG. 25A, the water droplet diameter of the PCM was initially 8 mm and a water droplet flow-time is within 5 sec both of which show the excellent hydrophilicity. However, during the wet/dry test which has similar conditions to the operational conditions of an air conditioner heat exchanger, the water droplet diameter decreases and the water flow-time increases. Therefore, the hydrophilicity of the PCM rapidly deteriorates. FIGS. 25B through 25E show results of the aging test on the surface-treated material according to the present invention, wherein, according to the result, the surface-treated material which has the water droplet diameter of about 6 mm, that is a 28° contact angle, but the pressure loss thereof was lower than PCM, and a water flow-time thereof is about 30 sec. Particularly, although the wet/dry cycling proceeded, no aging occurred and thus the initial properties of the material still remained.

Influences of Post-Processing by Oxygen Ions on Hydrophilicity

Figure 26:
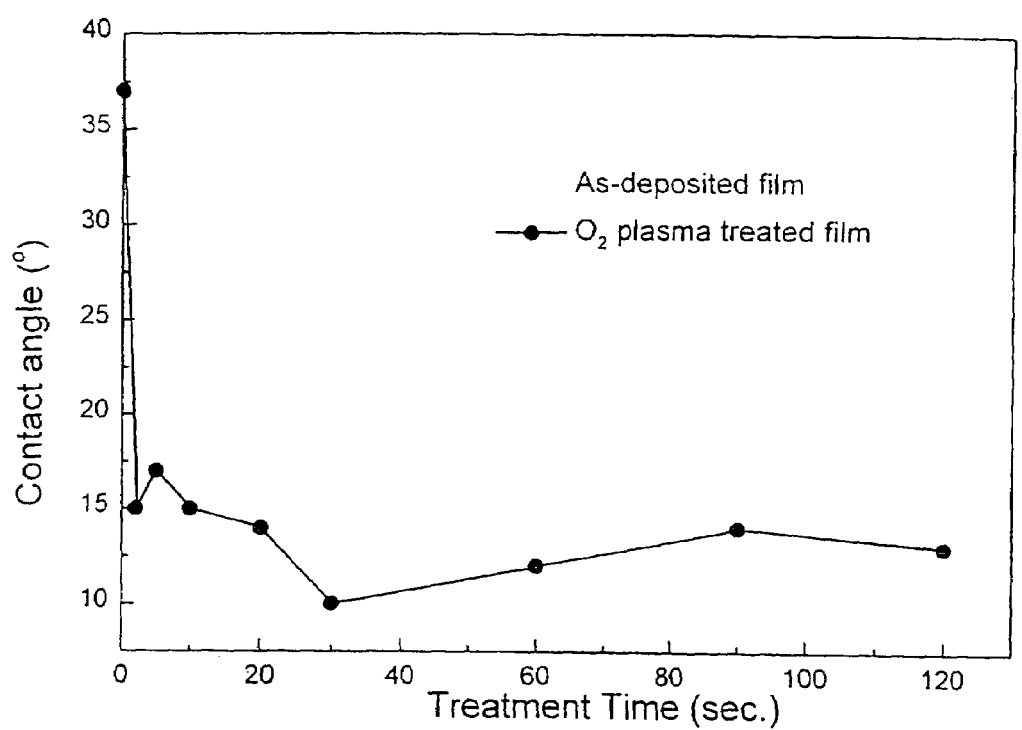
FIG. 26 illustrates a test result of painting a surface of an Al panel on which a polymer formed according to the plasma polymerization of the present invention was polymerized for 30 seconds and of testing the adhesion thereof by a tape experimental method.

FIG. 26 illustrates the change in contact angle with the lapse of processing time when a new polymer film is polymerized on a metal surface by using the DC plasma and post-processed by using an oxygen plasma. In the case that the polymer film is polymerized by using the DC plasma, the contact angle of water on the polymer is dependent upon conditions of the polymerization. In order to lower the contact angle of the polymer, it is processed by using an oxygen plasma in an identical experimental device after the polymerization. Here, the layer deposited on the anode is superior in adhesion and durability to the layer deposited on the cathode. During the post-processing, the electrodes are exchanged, namely anode to cathode, and vice versa. Although processed for only a short time, oxygen is bonded with a surface of the polymer, thereby increasing hydrophilicity. That is, the polymer film obtained according to the present invention is preferably surface-processed by a plasma of at least one non-polymerizable gas selected from a group consisting of $O_2$, $N_2$, $CO_2$, $CO$, $H_2O$ and $NH_3$ gas. Also, it is more preferable to use the non-polymerizable gas with an inert gas.

FIG. 26 illustrates the change in contact angle with the lapse of processing time when the polymer film polymerized by DC plasma is post-processed by using an oxygen plasma, an initial contact angle of which being 35 degrees. As shown therein, although only processed for a very short time, the contact angle is remarkably lowered.

Post Treatment by Ion Beam

Figure 27:
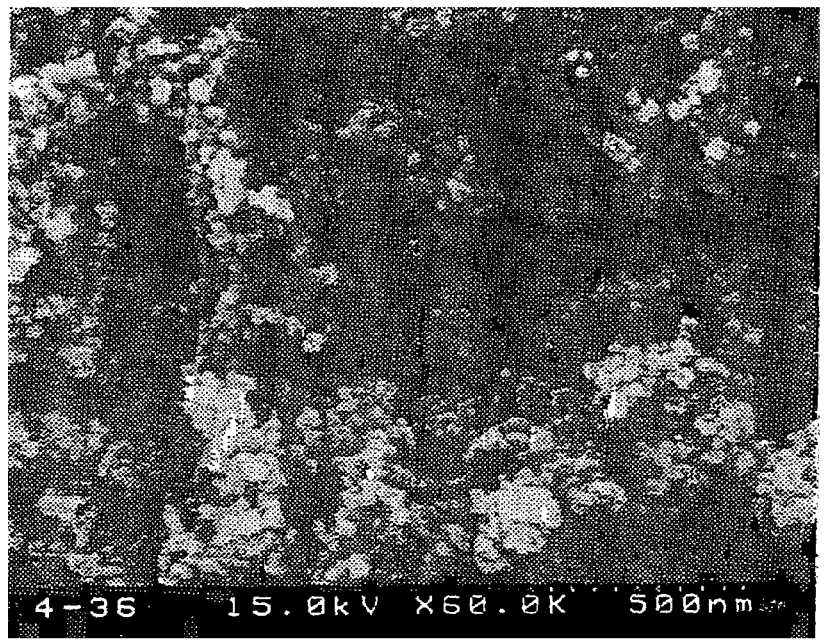
FIG. 27 is an SEM micrograph illustrating the surface of a polymer polymerized at the anode side by the DC discharge, photographed by a scanning electron microscope [current: 200 mA, gas pressure: 0.3 Torr (acetylene: 0.27 Torr, nitrogen: 0.03 Torr), processing time: 60 seconds]
Figure 28:
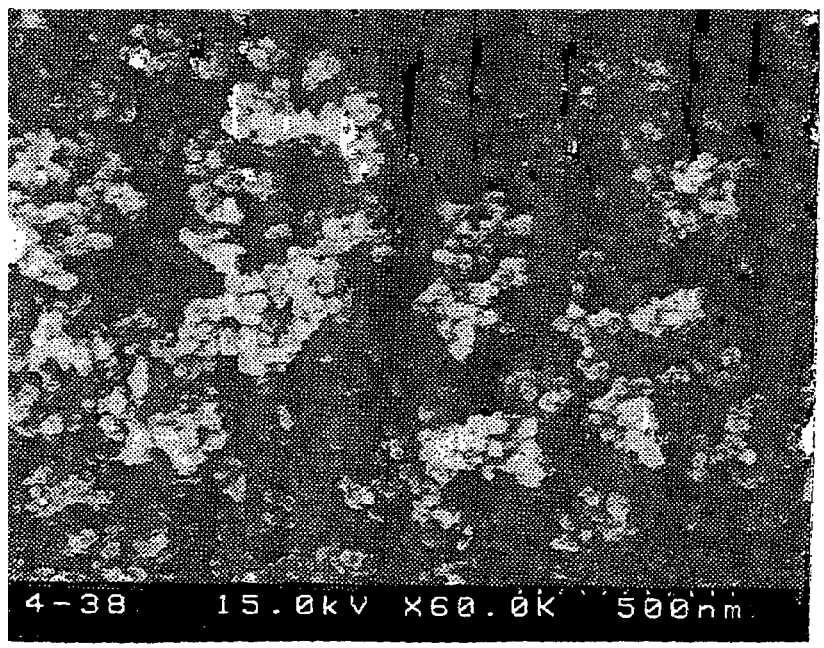
FIG. 28 is an SEM micrograph illustrating the surface of the polymer polymerized at the anode side by the DC discharge, photographed by a scanning electron microscope [current: 200 mA, gas pressure: 0.3 Torr (acetylene: 0.27 Torr, nitrogen: 0.03 Torr), processing time: 90 seconds]
Figure 29:
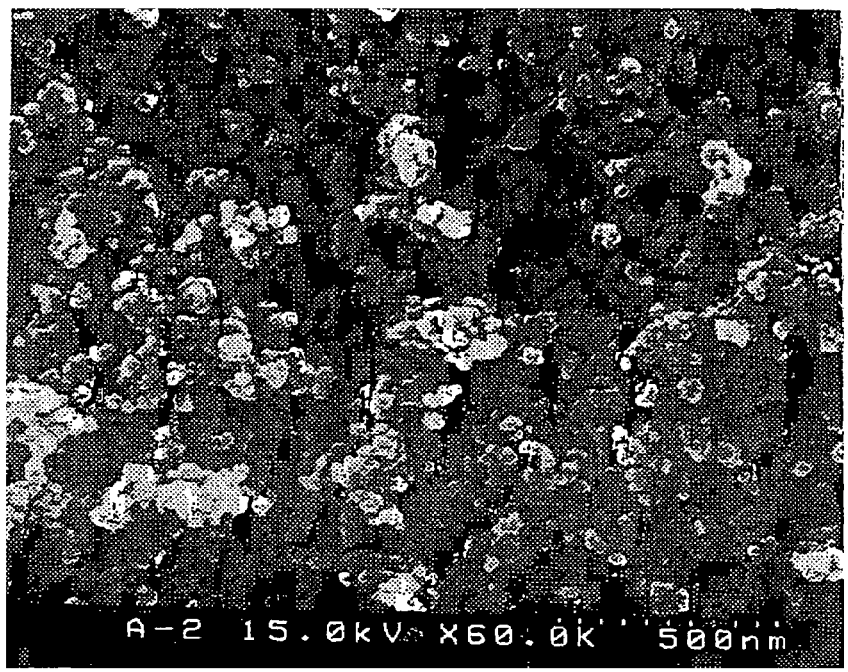
FIG. 29 is an SEM micrograph illustrating the surface of the polymer polymerized at the anode side by the DC discharge, which was processed with $Ar^+$ ion beam and photographed by a scanning electron microscope [current: 200 mA, gas pressure: 0.3 Torr (acetylene: 0.27 Torr, nitrogen: 0.03 Torr), processing time: 60 seconds, ion dose: $10^{15}$ ions/cm$^2$]
Figure 30:
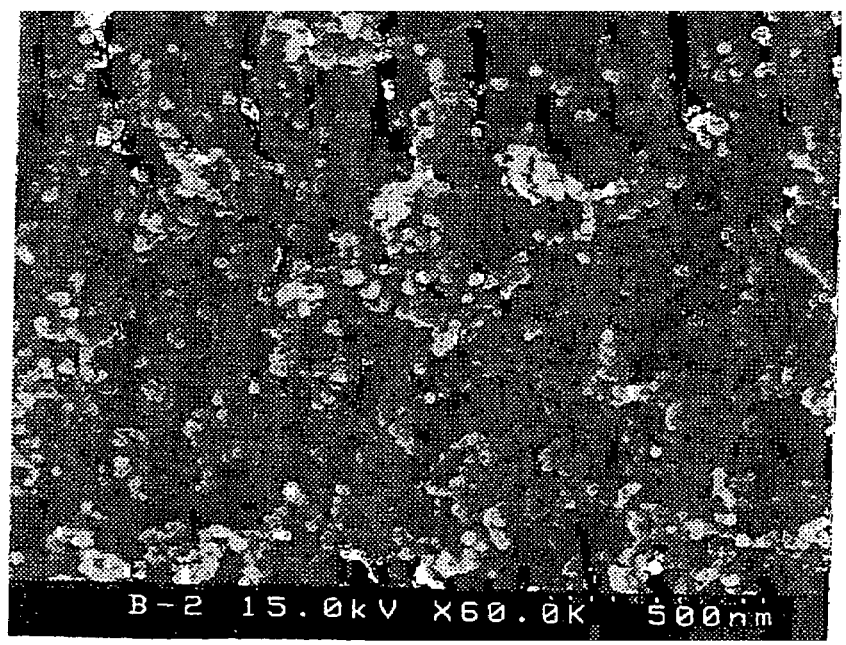
FIG. 30 is an SEM micrograph illustrating the surface of the polymer polymerized at the anode side by the DC discharge, which was processed with $Ar^+$ ion beam and photographed by a scanning electron microscope [current: 200 mA, gas pressure: 0.3 Torr (acetylene: 0.27 Torr, nitrogen: 0.03 Torr), processing time: 60 seconds, ion dose: $3 \times 10^{15}$ ions/cm$^2$]
Figure 31:
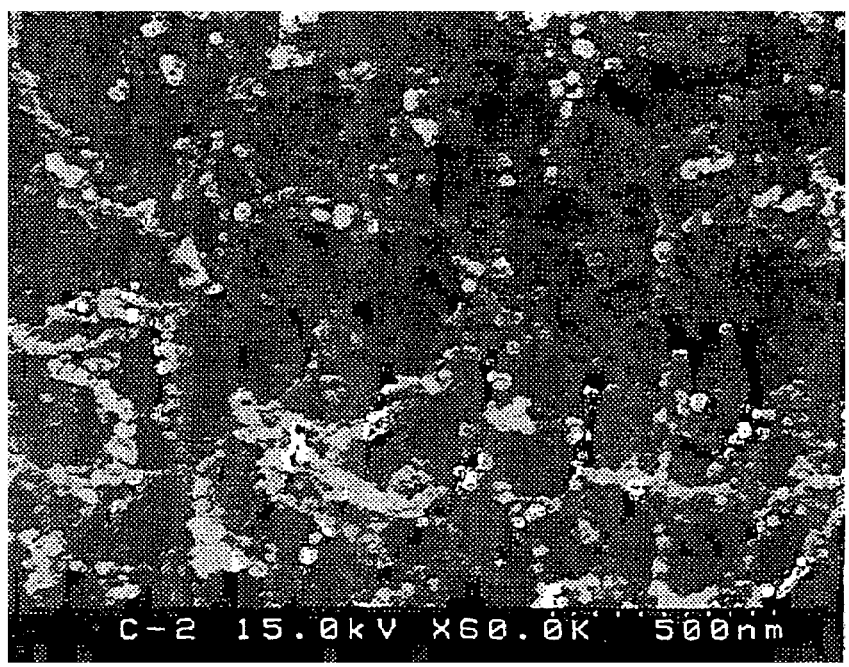
FIG. 31 is an SEM micrograph illustrating the surface of the polymer polymerized at the anode side by the DC discharge, which was processed with $Ar^+$ ion beam and photographed by a scanning electron microscope [current: 200 mA, gas pressure: 0.3 Torr (acetylene: 0.27 Torr, nitrogen: 0.03 Torr), processing time: 60 seconds, ion dose: $10^{16}$ ions/cm$^2$]
Figure 32:
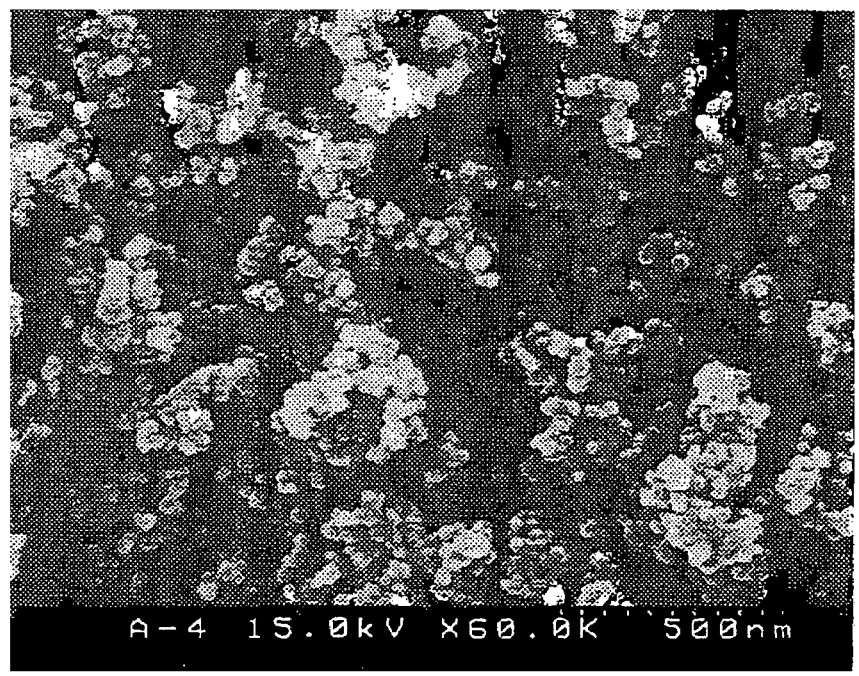
FIG. 32 is an SEM micrograph illustrating the surface of the polymer polymerized at the anode side by the DC discharge, which was processed with $Ar^+$ ion beam and photographed by a scanning electron microscope [current: 200 mA, gas pressure: 0.3 Torr (acetylene: 0.27 Torr, nitrogen: 0.03 Torr), processing time: 90 seconds, ion dose: $10^{15}$ ions/cm$^2$]
Figure 33:
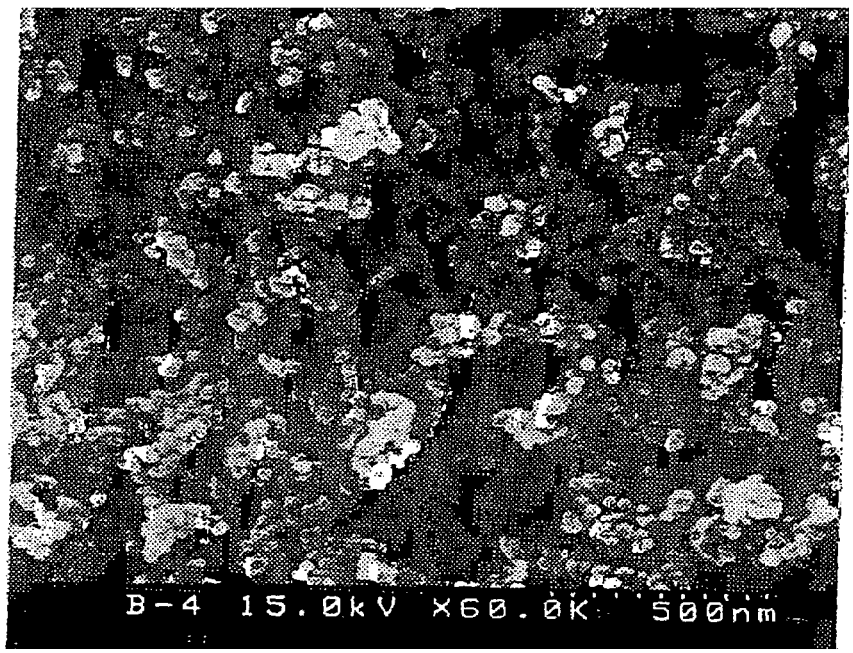
FIG. 33 is an SEM micrograph illustrating the surface of the polymer polymerized at the anode side by the DC discharge, which was processed with $Ar^+$ ion beam and photographed by a scanning electron microscope [current: 200 mA, gas pressure: 0.3 Torr (acetylene: 0.27 Torr, nitrogen: 0.03 Torr), processing time: 90 seconds, ion dose: $3 \times 10^{15}$ ions/cm$^2$]
Figure 34:
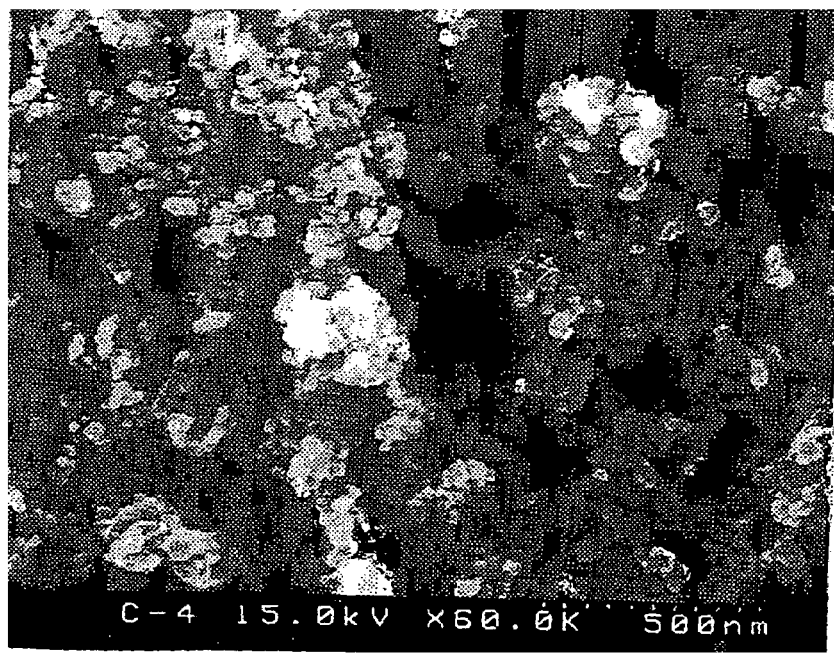
FIG. 34 is an SEM micrograph illustrating the surface of the polymer polymerized at the anode side by the DC discharge, which was processed with $Ar^+$ ion beam and photographed by a scanning electron microscope [current: 200 mA, gas pressure: 0.3 Torr (acetylene: 0.27 Torr, nitrogen: 0.03 Torr), processing time: 90 seconds, ion dose: $10^{16}$ ions/cm$^2$]

FIGS. 27 and 28 are SEM micrographs showing the surface of the polymers which polymerized to an anode side by the DC plasma with acetylene and nitrogen of which the ratio is 9:1 for 60 sec and 90 sec, respectively. In addition, FIGS. 29 through 31 are SEM micrographs showing the surface of the polymer which is polymerized to an anode side by the DC plasma with acetylene and nitrogen at 9:1 for 60 sec and then treated by $Ar^+$ ion beam (dose: $10^{15}$, $3 \times 10^{15}$, $10^{16}$ ions/$cm^2$). In addition, FIGS. 32 through 34 are SEM micrographs showing the surface of the polymer which is polymerized to an anode side by the DC plasma with acetylene and nitrogen at 9:1 for 90 sec and then treated by $Ar^+$ ion beam (dose: $10^{15}$, $3 \times 10^{15}$, $10^{16}$ ions/$cm^2$). As shown in FIGS. 29 through 34, the mean size of particles decreases after the ion beam treatment, there are no particles having relatively large diameters and the number of particles on the surface of the polymer polymerized to the material surface increases. Such a change can be clearly observed with the increase in the ion dose, and particularly the largest change is shown when the sample is treated by an ion beam at $10^{16}$ ions/$cm^2$ after the DC plasma for 60 sec.

Figure 35:
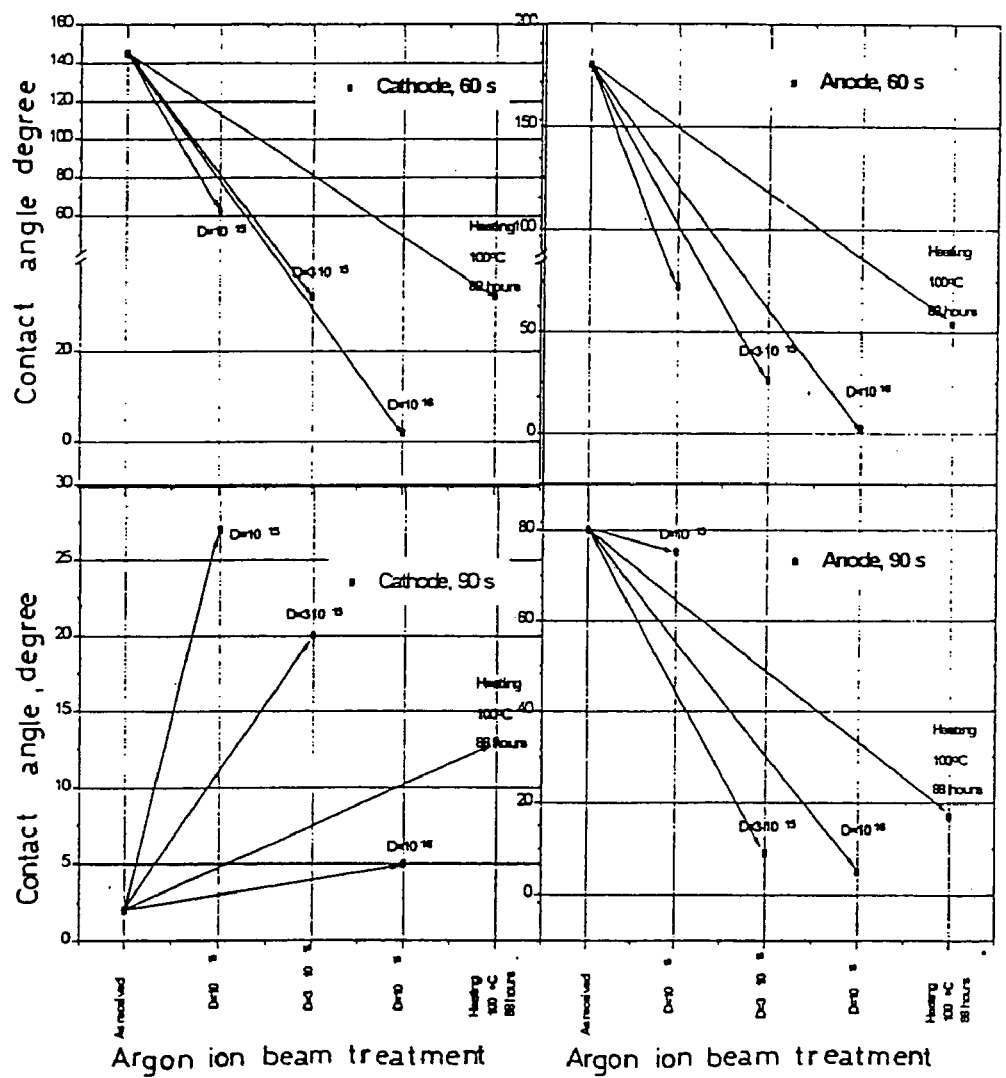
FIG. 35 illustrates a comparison result of the contact angle of an aluminum surface when it is plasma-processed at the cathode and anode sides and processed with $Ar^+$ beam and a contact angle of a sample exposed to the atmosphere at 100° C. for 88 hours (current: 200 mA, gas pressure: 0.3 Torr (acetylen: 0.27 Torr, nitrogen: 0.03 Torr), processing time: 60, 90 seconds, ion dose: $10^{15}$, $3 \times 10^{15}$, $10^{16}$ ions/cm$^2$)

In FIG. 35, the contact angle of a sample which was plasma-treated and then treated by the ion beam with variable ion doses is compared with the contact angle of a sample which was plasma-treated and then exposed at a temperature of 100° C. for 88 hours. Here, the sample which was treated by the ion beam at $10^{16}$ ions/$cm^2$ has the lowest contact angle. Accordingly, in order to improve the hydrophilicity, there is an optimum ion-beam condition and it is judged that the ion-beam treatment is effective for decreasing the contact angle.

Polymerization of Hydrophobic Polymer

A polymer with hydrophobicity can be polymerized by using a monomer containing fluorine in accordance with a process similar to the above-mentioned polymerization. Polymerization was performed using $C_2H_2F_2$ (vinylidenefluoride) by DC plasma polymerization under conditions that the DC current is 2 mA/$cm^2$, total pressure of the monomer in the vacuum chamber is 0.1, 0.2 and 0.3 Torr, respectively and polymerization time is 10 and 30 sec. Polymers obtained under the above conditions have excellent hydrophobicity and particularly a polymer, which is polymerized at the anode under the conditions of 0.2 Torr and 30 sec of polymerization time, has a property of not being wetted at all by water and has a 180° contact angle with water. Further, in the polymerization of the hydrophobic polymer, polymers obtained from both the anode and cathode show hydrophobicity, but the polymers which are polymerized at the anode have better hydrophobicity. Table 6 shows various contact angles of the hydrophobic polymers with water in accordance with each polymerizing condition.

TABLE 6

Contact angles of the hydrophobic polymers with water in accordance with each polymerizing condition when polymerizing vinylidenefluoride to a metallic surface by using the DC discharge.

| | 10 sec. | | 30 sec. | |
| --- | --- | --- | --- | --- |
| | Anode | Cathode | Anode | Cathode |
| 0.1 Torr | 115° | 130° | 88° | 92° |
| 0.2 Torr | 130° | 125° | 180° | 130° |
| 0.3 Torr | 105° | 96° | 142° | 112° |

Figure 36:
FIG. 36 is a photograph showing a hydrophobic property when a polymer polymerized according to the DC plasma polymerization by using $C_2H_2F_2$ (vinylidenefluoride) is contacted by water.

FIG. 36 is a photograph showing the hydrophobicity of the polymer obtained by the DC plasma polymerization by using vinylidenefluoride plasma.

The polymerization using the monomer containing fluorine can also be performed by RF plasma polymerization. Table 7 shows various contact angles with water of polymers in accordance with the change in RF power and polymerization time.

TABLE 7

Contact angles with water of the polymers in accordance with change of RF power and polymerization time by using $C_2H_2F_2$ (vinylidenefluoride)

|  | 10 sec | | 30 sec | |
| --- | --- | --- | --- | --- |
|  | Active | Passive | Active | Passive |
| 100 W | 130° | 112° | 130° | 68° |
| 150 W | 110° | 82° | 88° | 60° |

As shown therein, the hydrophobic polymer achieved by the RF plasma polymerization also has excellent hydrophobicity. However, the polymers which are polymerized at the anode by the DC plasma polymerization have the best hydrophobicity among the obtained polymers. Further, as the hydrophobic material for the plasma polymerization, not only $C_2H_2F_2$ (vinylidenefluoride) may be applied, but also other fluorine-containing monomers and/or a silicone-containing monomer can be applied.

Surface Treatment of an Inner Wall of a Copper Tube for a Heat Exchanger

The surface treatment according to the present invention can be applied to an inner wall of a copper tube used for a refrigerating and air-conditioning apparatus. Here, a condenser reduces the-temperature of a refrigerant which is compressed at high pressure and temperature, that is when the gaseous refrigerant which is compressed at the high pressure and temperature undergoes a phase change while passing through the condenser, the liquid refrigerant is irregularly drenched to the inner wall of the cooper tube. Therefore, the condensed heat-conducting amount of a gas decreases and accordingly the condensed heat-conducting property deteriorates. Also, the liquid refrigerant is gradually evaporated in an evaporator. However, the liquid refrigerant at a low temperature is not evenly spread out at a wall side of the tube of the evaporator, which leads to an increase in the pressure loss. To make up for such problem, grooves are formed at inside diameters of the tubes of the condenser and evaporator to increase the surface area for thereby improving the thermal conductivity, each tube of the condenser and evaporator being called a groove tube.

Figure 37:
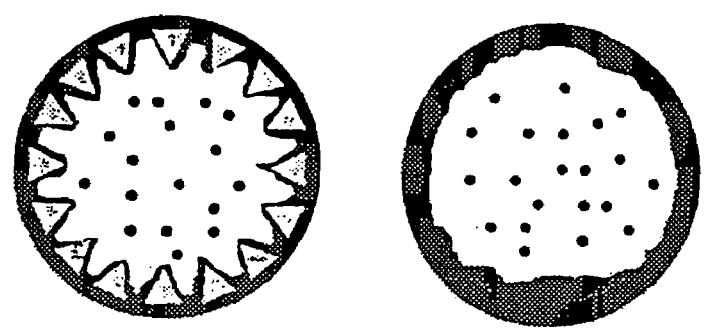
FIG. 37 is a diagram illustrating a case that a hydrophilic surface process is carried out on inner and outer surfaces of a copper pipe for a heat exchanger.

When applying a hydrophilic surface treatment to an internal surface of the groove tube, the low-temperature liquid refrigerant is heat-exchanged and gradually evaporates while being introduced into the evaporator. Here, when such refrigerant undergoes a two-phase change, the low-temperature liquid refrigerant is regularly drenched to the surface of the tube, so that the evaporation thermal conductivity is improved. Further, since the liquid refrigerant is evenly drenched to the surface thereof, an ultramicroscopic polymer layer is formed at the inner wall of the copper tube and thereby the pressure loss of the oil path area decreases. FIG. 37 is a diagram illustrating which the hydrophilic polymer polymerized onto the inner wall of the copper tube.

Figure 38:
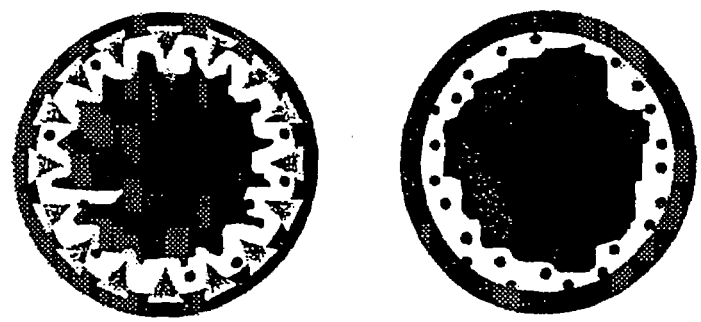
FIG. 38 is a diagram illustrating a case that a hydrophobic surface process is carried out on the inner and outer surfaces of the copper pipe for the heat exchanger.

Further, when applying a hydrophobic surface treatment to the wall of the groove tube of the condenser, when the refrigerant undergoes a phase change, the liquid refrigerant is not drenched onto a surface of the tube due to the hydrophobic treatment of the surface thereof and the gaseous refrigerant which has a temperature higher than the liquid refrigerant spreads out at the surface of the tube which leads to the improvement in the condensation thermal conductivity. In addition, since the gaseous refrigerant exists at the surface of the tube, the friction of the copper tube diminishes and the pressure loss accordingly decreases by the reduced friction. FIG. 38 is a diagram illustrating the hydrophobic polymer polymerized to the inner wall of the copper tube.

Paint Adhesion Test

Figure 39:
FIG. 39 illustrates a test result of applying paint to a surface of an Al panel on which a polymer was polymerized for 30 seconds according to the plasma polymerization of the present invention and testing the adhesion thereof by a tape experimental method.
Figure 40:
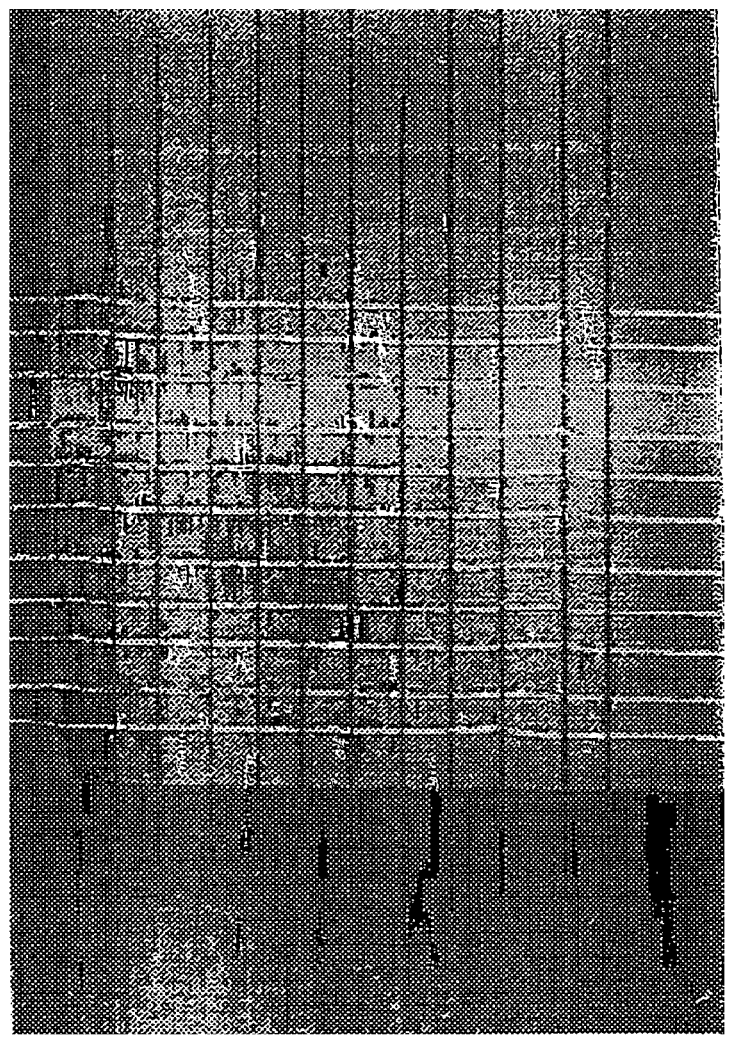
FIG. 40 is an enlarged photograph of the substrate in FIG. 39.
Figure 41:
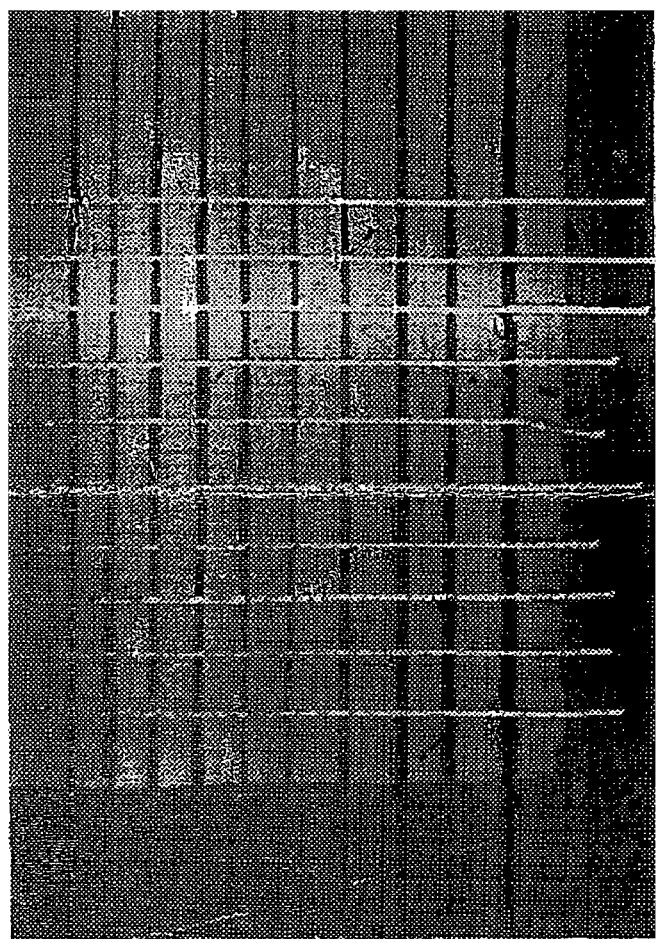
FIG. 41 illustrates a test result of painting a surface of the polymer which was polymerized for 60 seconds under the identical conditions to FIG. 39 and testing the adhesion thereof by the tape experimental method.

The excellent hydrophilicity obtained according to the present invention as well as an adhesion property which is closely related to the hydrophilicity can be applied to products. Since the hydrophilicity is closely related to the surface energy, the hydrophilicity and adhesion to a material, on which is be deposited or adhere to a surface of a product, improve as the surface energy increases. Since adhesion is related to the force which is required to separate materials which are stuck to each other, it is proportional to the surface energy. Accordingly, as the surface energy increases, the adhesion improves. Thus, the polymer with the excellent hydrophilicity which is achieved by the plasma polymerization can be applied to the application to improve the adhesion. Here, the improvement of paint adhesion to an aluminum panel is taken as an example. Generally, when applying paint to an aluminum panel, adhesion of the paint is undesirably weak and thus the paint on the panel inevitably peels off in time. However, such problem can be solved by applying the paint to the aluminum panel after polymerizing the aluminum surface by the plasma polymerization according to the present invention. In FIG. 39, there is shown an adhesion test which is performed by a tape testing method after the plasma polymerization is applied onto the aluminum panel for 30 sec and paint is applied thereto. Here, it is noted that there is formed a square mold for the adhesion test. As shown therein, the paint partly peels off, but generally the paint applied on the panel shows excellent adhesion strength. FIG. 40 is an enlarged photograph of the substrate in FIG. 39, wherein except for the part in which the paint peels off, the paint applied on the polymer formed by the plasma polymerization shows excellent adhesion strength. In FIG. 41, an adhesion test is shown, the test being performed after the plasma polymerization is applied onto the aluminum panel for 60 sec. As can be seen therein, the polymer of the 60 sec-plasma polymerization has better adhesion strength than that of the 30 sec-plasma polymerization. Further, the paint applied on the polymer in FIG. 41 does not even have a peeled portion and shows the excellent adhesion strength in general. As described above, the polymer with the excellent hydrophilicity which is obtained by the plasma polymerization according to the present invention can be applied to the application to improve the adhesion.

Also, in order to perform a surface adhesion test of samples which have different surface energy from each other together with the paint adhesion test which is above-described, by attaching a tape to a sample and gradually separating the tape from the sample by applying the physical force thereto, the change of the force being applied to the sample is measured by connecting the sample to a force sensor. In case of a bare sample without any surface-treatment, the force is shown at about 0.2 kgf and radically decreases, meaning that the adhesion between the sample and the tape adhesive is about 0.2 kgf and it is possible to separate the tape from the sample with this force. In case of a PCM-treated sample, about 0.6 kgf is required to separate the tape from the sample, meaning that the surface adhesion of the PCM is 0.6 kgf. In case of a sample the surface of which had been treated according to the present invention, the force is uniformly shown at about 1.3 kgf. This is because the tape is cut off, not because the tape is separated from the sample at the force of 1.3 kgf.

Accordingly, it is found that the polymer according to the present invention has considerably large surface adhesion compared to the conventional art. Further, the adhesion between the adhesive of the tape and a hydrophillic film and the adhesion between the hydrophillic film and the substrate are very strong such that the tape is not naturally separated from the sample, but cut off, exhibiting that the adhesion force is formed over 1.3 kgf.

Corrosion-Resistance Test

Figure 42:
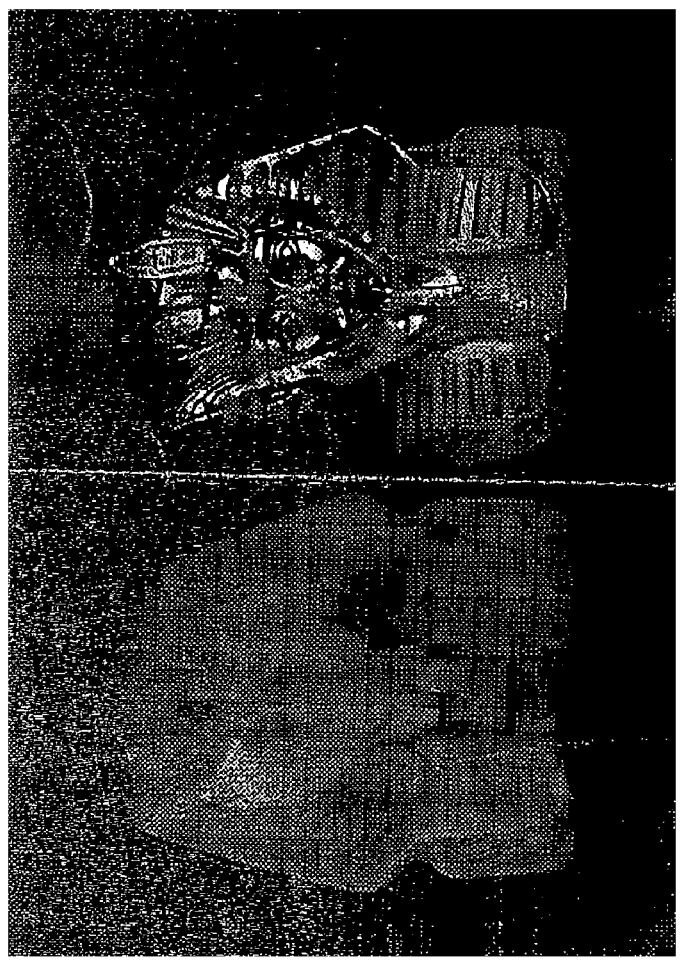
FIG. 42 illustrates a test result of the corrosion-resistant property of the polymer, a bust at the left side being a bust made of bronze which was not processed, a bust at the right side being a bust on which the polymer was deposited by the plasma polymerization, both busts being soaked in 5% NaCl solution for 3 days.

To examine the corrosion-resistance of the polymer achieved by the plasma polymerization, a bronze bust and a polymer-coated bronze bust were respectively placed in a 5% NaCl solution for 3 days and the corrosion degree of the two busts are observed. The result of the test is shown in FIG. 42. As shown therein, the bust on the left side which did not receive the plasma polymerization, was severely corroded in the 5% NaCl solution, while no corrosion occurred to the bust on the right side on which the polymer is deposited according to the plasma polymerization of the invention. Therefore, it is certain that the polymer obtained by the plasma polymerization according to the present invention has excellent corrosion-resistance. As described above, a material with a novel chemical structure is produced on a surface of a substrate by mixing monomers of materials to be deposited on the substrate under conditions of relatively low energy and vacuum and generating a potential difference between the substrate and particles to be deposited thereon by a DC or RF plasma. Here, various chemical bonds can be achieved in accordance with the type of reaction gas, the DC current, voltage, RF power and deposition time, and therefore it is possible, as desired, to obtain a change in surface mechanical strength, adhesion, adsorption, hydrophilicity and hydrophobicity according to the present invention. In addition, by using such process, it is possible to produce the materials on the surface of the substrate without affecting any property of the substrate.

It will be apparent to those skilled in the art that various modifications and variations can be made in the plasma polymerization on the surface of the material for use in refrigerating and air conditioning of the present invention without departing from the spirit or scope of the invention. Thus, it is intended that the present invention cover modifications and variations of this invention provided they come within the scope of the appended claims and their equivalents.

The invention claimed is:

1. Copper tubing for heat exchanger, wherein the copper tubing has an inner wall with grooves coated with a plasma polymerized polymeric coating of a polymer resulting from plasma polymerization of an unsaturated aliphatic hydrocarbon monomer gas or a fluorine-containing monomer gas at a predetermined pressure and a non-polymerizable gas, said coating being formed by a method including the steps of:
   providing a plasma polymerization chamber which contains the copper inner wall surface as an anode electrically connected to a negative terminal of a DC power supply, and a cathode electrically connected to a positive terminal of the DC power supply;
   maintaining a pressure in the chamber at a predetermined level;
   blowing an unsaturated aliphatic hydrocarbon monomer gas or a fluorine-containing monomer gas at a predetermined pressure and a non-polymerizable gas at a predetermined pressure into the chamber; and
   applying a voltage to the anode and cathode in order to obtain a DC plasma consisting of positive and negative ions and radicals generated from the unsaturated aliphatic hydrocarbon monomer gas or fluorine-containing monomer gas and non-polymerizable gas so as to form a polymeric coating on the copper inner wall surface by plasma deposition,
   wherein the unsaturated aliphatic hydrocarbon monomer gas includes acetylene and the non-polymerizable gas includes nitrogen and,
   wherein the polymerized polymeric coating results from a ratio of acetylene to nitrogen in the plasma discharge of about 1:1.

2. A heat exchanger system for a refrigeration or air conditioning system comprising a condenser and an evaporator operatively connected by copper tubing having an inner wall with grooves coated with a plasma polymerized polymeric coating resulting from the plasma polymerization of vinylidenefluoride, said plasma polymerized coating being formed by a method including the steps of:
   providing a plasma polymerization chamber which contains the copper inner wall surface as an anode electrically connected to a negative terminal of a DC power supply, and a cathode electrically connected to a positive terminal of the DC power supply;
   maintaining a pressure in the chamber at a predetermined level;
   blowing vinlyidenefluoride gas at a predetermined pressure into the chamber; and
   applying a voltage to the anode and cathode in order to obtain a DC plasma consisting of positive and negative ions and radicals generated from the vinlyidenefluoride gas so as to form a polymeric coating on the copper inner wall surface by plasma deposition.

* * * * *